(12) United States Patent
Boukai et al.

(10) Patent No.: US 10,749,094 B2
(45) Date of Patent: Aug. 18, 2020

(54) THERMOELECTRIC DEVICES, SYSTEMS AND METHODS

(71) Applicant: THE REGENTS OF THE UNIVERSITY OF MICHIGAN, Ann Arbor, MI (US)

(72) Inventors: Akram I. Boukai, Ann Arbor, MI (US); Anish Tuteja, Ann Arbor, MI (US); Duck Hyun Lee, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 489 days.

(21) Appl. No.: 15/363,972

(22) Filed: Nov. 29, 2016

(65) Prior Publication Data

US 2017/0162776 A1 Jun. 8, 2017

Related U.S. Application Data

(62) Division of application No. 13/550,424, filed on Jul. 16, 2012, now abandoned.
(Continued)

(51) Int. Cl.
*H01L 35/32* (2006.01)
*B82Y 30/00* (2011.01)
(Continued)

(52) U.S. Cl.
CPC ........ *H01L 35/34* (2013.01); *H01L 21/30604* (2013.01); *H01L 21/30625* (2013.01);
(Continued)

(58) Field of Classification Search
CPC ... H01L 35/34; H01L 35/32; H01L 21/32135; H01L 21/32133; H01L 21/30604;
(Continued)

(56) References Cited

U.S. PATENT DOCUMENTS

| 365,990 A | 7/1887 | Giles |
| 3,653,989 A | 4/1972 | Widmer |

(Continued)

FOREIGN PATENT DOCUMENTS

| CN | 1382626 A | 12/2002 |
| CN | 101449403 A | 6/2009 |

(Continued)

OTHER PUBLICATIONS

International search report and written opinion dated Dec. 27, 2013 for PCT/US2013/0554621.†

(Continued)

*Primary Examiner* — Matthew T Martin
(74) *Attorney, Agent, or Firm* — Harness, Dickey & Pierce, P.L.C.

(57) ABSTRACT

A method for forming a thermoelectric element for use in a thermoelectric device comprises forming a mask adjacent to a substrate. The mask can include three-dimensional structures phase-separated in a polymer matrix. The three-dimensional structures can be removed to provide a plurality of holes in the polymer matrix. The plurality of holes can expose portions of the substrate. A layer of a metallic material can be deposited adjacent to the mask and exposed portions of the substrate. The mask can then be removed. The metallic material is then exposed to an oxidizing agent and an etchant to form holes or wires in the substrate.

11 Claims, 16 Drawing Sheets

Related U.S. Application Data

(60) Provisional application No. 61/565,440, filed on Nov. 30, 2011, provisional application No. 61/508,798, filed on Jul. 18, 2011.

(51) Int. Cl.

| | | |
|---|---|---|
| *H01L 35/34* | (2006.01) | |
| *H01L 35/22* | (2006.01) | |
| *H01L 21/3213* | (2006.01) | |
| *H01L 21/306* | (2006.01) | |
| *H01L 21/3105* | (2006.01) | |
| H01L 21/3063 | (2006.01) | |
| H01L 21/302 | (2006.01) | |
| H01L 21/02 | (2006.01) | |

(52) U.S. Cl.
CPC .. *H01L 21/31055* (2013.01); *H01L 21/32135* (2013.01); *H01L 35/22* (2013.01); *H01L 35/32* (2013.01); *B82Y 30/00* (2013.01); *H01L 21/02019* (2013.01); *H01L 21/302* (2013.01); *H01L 21/3063* (2013.01)

(58) Field of Classification Search
CPC ......... H01L 21/31055; H01L 21/30621; H01L 21/302; H01L 21/3063; H01L 21/30625; H01L 21/02019; H01L 21/306; H01L 21/30608; H01L 21/0475
See application file for complete search history.

(56) References Cited

U.S. PATENT DOCUMENTS

| | | |
|---|---|---|
| 4,070,821 A | 1/1978 | Somogyi |
| 4,078,945 A | 3/1978 | Gonsiorawski |
| 4,092,445 A | 5/1978 | Tsuzuki et al. |
| 4,106,279 A | 8/1978 | Martin et al. |
| 4,261,049 A | 4/1981 | Komiyama et al. |
| 4,681,657 A | 7/1987 | Hwang et al. |
| 4,985,722 A | 1/1991 | Ushijima |
| 5,089,293 A | 2/1992 | Bohara et al. |
| 5,139,624 A | 8/1992 | Searson et al. |
| D332,408 S | 1/1993 | Chodat et al. |
| 5,206,523 A | 4/1993 | Goesele et al. |
| D365,767 S | 1/1996 | Hitter |
| 5,552,328 A | 9/1996 | Orlowski et al. |
| 5,565,064 A | 10/1996 | Lee et al. |
| 5,695,557 A | 12/1997 | Yamagata et al. |
| 5,767,020 A | 6/1998 | Sakaguchi et al. |
| 5,837,929 A | 11/1998 | Adelman |
| 5,868,947 A | 2/1999 | Sakaguchi et al. |
| 5,873,003 A | 2/1999 | Inoue et al. |
| 5,889,735 A | 3/1999 | Kawata et al. |
| 5,895,223 A | 4/1999 | Peng et al. |
| D409,097 S | 5/1999 | Monachon |
| 5,970,361 A | 10/1999 | Kumomi et al. |
| 5,981,400 A | 11/1999 | Lo |
| 5,990,605 A | 11/1999 | Yoshikawa et al. |
| 6,017,811 A | 1/2000 | Winton et al. |
| 6,093,941 A | 7/2000 | Russell et al. |
| 6,194,323 B1 | 2/2001 | Downey et al. |
| 6,222,114 B1 | 4/2001 | Mitamura |
| 6,304,520 B1 | 10/2001 | Watanabe |
| 6,304,521 B1 | 10/2001 | Kanesaka |
| 6,313,015 B1 | 11/2001 | Lee et al. |
| 6,407,965 B1 | 6/2002 | Matoge et al. |
| 6,762,134 B2 | 7/2004 | Bohn et al. |
| 6,775,164 B2 | 8/2004 | Wong et al. |
| 6,790,785 B1 | 9/2004 | Li et al. |
| 6,803,260 B2 | 10/2004 | Shin et al. |
| 6,882,051 B2 | 4/2005 | Majumdar et al. |
| D504,624 S | 5/2005 | Bodino |
| 7,075,161 B2 | 7/2006 | Barth |
| 7,115,971 B2 | 10/2006 | Stumbo et al. |
| 7,135,728 B2 | 11/2006 | Duan et al. |
| 7,161,168 B2 | 1/2007 | Heath et al. |
| D536,994 S | 2/2007 | Sugisawa et al. |
| 7,189,435 B2 | 3/2007 | Tuominen et al. |
| 7,190,049 B2 | 3/2007 | Tuominen et al. |
| 7,254,953 B2 | 8/2007 | Callas et al. |
| 7,291,282 B2 | 11/2007 | Tong |
| 7,309,830 B2 | 12/2007 | Zhang et al. |
| 7,465,871 B2 | 12/2008 | Chen et al. |
| 7,515,790 B2 | 4/2009 | Choi |
| 7,572,669 B2 | 6/2009 | Tuominen et al. |
| 7,569,941 B2 | 8/2009 | Majumdar et al. |
| 7,629,531 B2 | 12/2009 | Stark |
| 7,645,625 B2 | 1/2010 | Ono et al. |
| 7,675,084 B2 | 3/2010 | Wierer, Jr. et al. |
| 7,960,258 B2 | 6/2011 | Chao et al. |
| D646,183 S | 10/2011 | De Witt |
| 8,048,371 B1 | 11/2011 | Kapur et al. |
| 8,087,254 B2 | 1/2012 | Arnold |
| 8,101,449 B2 | 1/2012 | Liang et al. |
| 8,278,191 B2 | 10/2012 | Hildreth et al. |
| 8,324,699 B2 | 12/2012 | Ichijo et al. |
| 8,486,843 B2 | 7/2013 | Li et al. |
| 8,641,912 B2 | 2/2014 | Heath et al. |
| 8,980,656 B2 | 3/2015 | Li et al. |
| D729,638 S | 5/2015 | Favre |
| 9,065,016 B2 | 6/2015 | Peter et al. |
| D736,103 S | 8/2015 | Behling |
| D744,866 S | 12/2015 | Behling |
| 9,209,375 B2 | 12/2015 | Boukai et al. |
| 9,263,662 B2 | 2/2016 | Boukai et al. |
| D752,045 S | 3/2016 | Kim et al. |
| 9,419,198 B2 | 8/2016 | Yu et al. |
| 9,419,498 B2 | 8/2016 | Kimura et al. |
| 9,515,246 B2 | 12/2016 | Boukai et al. |
| D819,627 S | 6/2018 | Boukai et al. |
| 10,003,004 B2 | 6/2018 | Boukai et al. |
| 10,205,080 B2 | 2/2019 | Boukai et al. |
| 10,290,796 B2 | 5/2019 | Boukai et al. |
| 10,305,014 B2 | 5/2019 | Boukai et al. |
| 2002/0124576 A1 | 9/2002 | Loibl et al. |
| 2003/0146797 A1 | 8/2003 | Atsumi et al. |
| 2004/0152240 A1 | 8/2004 | Dangelo |
| 2005/0133254 A1 | 6/2005 | Tsakalakos |
| 2005/0176264 A1 | 8/2005 | Lai et al. |
| 2005/0215063 A1 | 9/2005 | Bergman |
| 2005/0253138 A1 | 11/2005 | Choi et al. |
| 2006/0032526 A1 | 2/2006 | Fukutani et al. |
| 2006/0118158 A1 | 6/2006 | Zhang et al. |
| 2006/0185710 A1 | 8/2006 | Yang et al. |
| 2007/0258213 A1 | 11/2007 | Chen et al. |
| 2007/0261730 A1 | 11/2007 | Seker et al. |
| 2007/0277866 A1 | 12/2007 | Sander et al. |
| 2008/0019876 A1 | 1/2008 | Chau et al. |
| 2008/0112669 A1 | 5/2008 | Choi et al. |
| 2008/0173344 A1 | 7/2008 | Zhang et al. |
| 2008/0257395 A1 | 10/2008 | Jovanovic et al. |
| 2008/0271772 A1 | 11/2008 | Leonov et al. |
| 2008/0314429 A1 | 12/2008 | Leonov |
| 2009/0020148 A1 | 1/2009 | Boukai et al. |
| 2009/0020188 A1 | 1/2009 | Ulicny et al. |
| 2009/0069045 A1 | 3/2009 | Cheng |
| 2009/0117741 A1 | 5/2009 | Heath et al. |
| 2010/0035163 A1 | 2/2010 | Kobrin |
| 2010/0059789 A1 | 3/2010 | Choi |
| 2010/0065810 A1 | 3/2010 | Goesele et al. |
| 2010/0126548 A1 | 5/2010 | Jang et al. |
| 2010/0147350 A1 | 6/2010 | Chou et al. |
| 2010/0193001 A1 | 8/2010 | Hirono et al. |
| 2010/0248449 A1 | 9/2010 | Hildreth et al. |
| 2011/0003279 A1 | 1/2011 | Patel et al. |
| 2011/0088739 A1 | 4/2011 | Zinn et al. |
| 2011/0114145 A1 | 5/2011 | Yang et al. |
| 2011/0114146 A1 | 5/2011 | Scullin |
| 2011/0168978 A1 | 7/2011 | Kochergin |
| 2011/0179806 A1 | 7/2011 | Ipposhi et al. |
| 2011/0210416 A1 | 9/2011 | Mantese |
| 2011/0215441 A1 | 9/2011 | Lin et al. |
| 2011/0263119 A1 | 10/2011 | Li et al. |
| 2011/0266521 A1 | 11/2011 | Ferrari et al. |

(56) References Cited

U.S. PATENT DOCUMENTS

| | | |
|---|---|---|
| 2012/0097204 A1 | 4/2012 | Yu et al. |
| 2012/0152295 A1 | 6/2012 | Matus et al. |
| 2012/0160290 A1 | 6/2012 | Chen et al. |
| 2012/0167936 A1 | 7/2012 | Park et al. |
| 2012/0174956 A1 | 7/2012 | Smythe et al. |
| 2012/0217165 A1 | 8/2012 | Feng et al. |
| 2012/0282435 A1 | 11/2012 | Yang et al. |
| 2012/0290051 A1 | 11/2012 | Boyden et al. |
| 2012/0295074 A1 | 11/2012 | Yi et al. |
| 2012/0319082 A1 | 12/2012 | Yi et al. |
| 2012/0326097 A1 | 12/2012 | Ren et al. |
| 2013/0000688 A1 | 1/2013 | Cho et al. |
| 2013/0019918 A1 | 1/2013 | Boukai et al. |
| 2013/0052762 A1 | 2/2013 | Li et al. |
| 2013/0087180 A1 | 4/2013 | Stark et al. |
| 2013/0117380 A1 | 5/2013 | Pomazanov et al. |
| 2013/0143407 A1 | 6/2013 | Lin et al. |
| 2013/0175484 A1 | 7/2013 | Ren et al. |
| 2013/0186445 A1 | 7/2013 | Lorimer et al. |
| 2014/0117380 A1 | 5/2014 | Loboda et al. |
| 2014/0299169 A1 | 10/2014 | Schneider et al. |
| 2014/0306250 A1 | 10/2014 | Gardner et al. |
| 2014/0326287 A1 | 11/2014 | Wiant et al. |
| 2014/0373888 A1 | 12/2014 | Boukai et al. |
| 2015/0083180 A1 | 3/2015 | Lang |
| 2015/0101788 A1 | 4/2015 | Smith et al. |
| 2015/0128619 A1 | 5/2015 | Wild |
| 2015/0162517 A1 | 6/2015 | Kasichainula |
| 2015/0179911 A1 | 6/2015 | Lemmer et al. |
| 2015/0216718 A1 | 8/2015 | Diller et al. |
| 2015/0228883 A1 | 8/2015 | Boukai et al. |
| 2015/0245699 A1 | 9/2015 | Nishi et al. |
| 2015/0270784 A1 | 9/2015 | Dillersberger |
| 2015/0280099 A1 | 10/2015 | Boukai et al. |
| 2015/0325772 A1 | 11/2015 | Boukai et al. |
| 2016/0035956 A1 | 2/2016 | Carroll et al. |
| 2016/0056360 A1 | 2/2016 | Cho et al. |
| 2016/0141480 A1 | 5/2016 | Zhu et al. |
| 2016/0197259 A1 | 7/2016 | Boukai et al. |
| 2016/0209111 A1 | 7/2016 | Jafa et al. |
| 2017/0162776 A1 | 6/2017 | Boukai et al. |
| 2017/0365766 A1 | 12/2017 | Boukai et al. |
| 2018/0240957 A1 | 8/2018 | Boukai et al. |
| 2018/0337320 A1 | 11/2018 | Boukai et al. |
| 2018/0351069 A1 | 12/2018 | Boukai et al. |

FOREIGN PATENT DOCUMENTS

| | | |
|---|---|---|
| JP | S63266829 A | 11/1988 |
| JP | H11317547 A | 11/1999 |
| JP | 2000259577 A | 9/2000 |
| JP | 2004193526 A | 7/2004 |
| JP | 2006261451 A | 9/2006 |
| JP | 2007300127 A | 11/2007 |
| JP | 2010192580 A | 9/2010 |
| JP | 2010537430 A | 12/2010 |
| WO | WO-0102556 A2 | 1/2001 |
| WO | 02/23607 A1 | 3/2002 |
| WO | 2009011975 A2 | 1/2009 |
| WO | 2009014985 A2 | 1/2009 |
| WO | 2010/003629 A2 | 1/2010 |
| WO | 2011/049804 A2 | 4/2011 |
| WO | 2012054777 A2 | 4/2012 |
| WO | 2012068426 A2 | 5/2012 |
| WO | 2013012842 A1 | 1/2013 |
| WO | 2013/109729 A1 | 7/2013 |
| WO | 2014/028903 A1 | 2/2014 |
| WO | 2014070795 A1 | 5/2014 |
| WO | 2014179622 A1 | 11/2014 |
| WO | 2015134394 A1 | 9/2015 |
| WO | 2015148554 A1 | 10/2015 |
| WO | 2016118083 A1 | 7/2016 |
| WO | 2017096094 A1 | 6/2017 |
| WO | 2017192738 A1 | 11/2017 |

OTHER PUBLICATIONS

International search report dated Feb. 10, 2014 for PCT/US2013/067346.†.

Joannopoulos, et al. Photonic crystals: putting a new twist on light, nature, 386: 143-149. (1997)†.

Jung, et al. Circuit Fabrication at 17 nm Half-Pitch by nanoimprint-tithography. nanoLetters, 6, 351. (2006)†.

Koga, et al. Experimental proof-of-principle investigation of enhanced Z3DT in (100) oriented Si/Ge superlattices. Applied Physics Letters 77, pp. 1490-1492. (2000)†.

Lee, et al. Enhanced thermoelectric figure-of-merit in nanostructured p-type silicon germanium bulk alloys. nano. Lett. 8(12):4670-4674. (2008)†.

Li, et al. Measuring thermal and thermoelectric properties of one-dimensional nanostructures using a microfabricated device. Journal of heart transfer, vol. 125, pp. 881-888. (2003)†.

Li, et al. Thermal conductivity of individual silicon nanowires. Applied Physics Letters, vol. 63, pp. 2934-2936. (2003)†.

Lifshitz, et al. Thermoelastic damping in micro- and nanomechanical systems. Physical Review B 61, pp. 5600-5609. (2000)†.

Liu, et al. Thermal conduction in ultrahigh pure and doped single-crystal silicon layers at high temperatures. Journal of Applied Physics 98, 123523. (2005)†.

Llaguno, et al. Observation of thermopower oscillations in the coulomb blockade regime in a semiconducting carbon nanotube, nano Lett. 4, pp. 45-49. (2004)†.

Mahan, et al. The best thermoelectric. PnAS 93, pp. 7436-7439. (1996)†.

Mahan, et al. Thermoelectric materials: new approaches to an old problem. Physics Today 50, pp. 42-47. (1997)†.

Maranganti, et al. Length scales at which classical elasticity breaks down for various materials. Physical Review Letters 98, 195504. (2007)†.

Martin, nanomaterials—membrane based synthetic approach. Science, v. 266, pp. 1961-1966. (1994)†.

Melosh, et al. Ultra-high density nanowire lattices and circuits. Science, vol. 300, pp. 112-115. (2003)†.

Morales, et al. A laser ablation method for the synthesis of semiconductor crystalline nanowires. Science, vol. 279, pp. 208-211. (1998)†.

NDT Resource Center, Thermal Conductivity. Downloaded Nov. 26, 2013. https://www.nde-ed.org/EducationResources/CommunityCollege/Materials/Physical_Chemical/ThermalConductivity.htm.

Notice of allowance dated Jul. 13, 2011 for U.S. Appl. No. 12/125,043.†.

Notice of allowance dated Oct. 2, 2013 for U.S. Appl. No. 12/125,0431.†.

Office action dated Jan. 9, 2015 for U.S. Appl. No. 12/175,027.†.
Office action dated Jan. 23, 2015 for U.S. Appl. No. 13/278,074.†.
Office action dated Feb. 18, 2011 for U.S. Appl. No. 12/125,043.†.
Office action dated Apr. 25, 2013 for U.S. Appl. No. 13/278,074.†.
Office action dated May 23, 2013 for U.S. Appl. No. 12/175,027.†.
Office action dated Jun. 22, 2011 for U.S. Appl. No. 12/175,027.†.
Office action dated Jun. 30, 2014 for U.S. Appl. No. 12/175,027.†.
Office action dated Jul. 18, 2014 for U.S. Appl. No. 13/278,074.†.
Office action dated Aug. 7, 2013 for U.S. Appl. No. 13/278,074.†.
Office action dated Nov. 10, 2010 for U.S. Appl. No. 12/175,027.†.
Office action dated Nov. 27, 2013 for U.S. Appl. No. 12/175,027.†.

Pearson. Survey of thermoelectric studies of the group-1 metals at low temperatures carried out at the national-research-laboratories, Ottawa. Soviet Physics-Solid State 3, pp. 1024-1033. (1961)†.

Peng, et al. Ordered silicon nanowire'arrays via nanosphere lithography and metal induced etching. Applied Physics Letters, v.90, article # 163123. (2007)†.

Qiu, et al. Large complete band gap in two-dimensional photonic crystals with elliptic air holes, Physical Review B, 60: pp. 10 610-10 612. (1999)†.

Routkevitch, et al. Electrochemical Fabrication of CdS nanowires arrays in porous anodic aluminum oxide templates, The Journal of Physical Chemistry, v. 100, pp. 14037-14047. (1996)†.

She, et al. Fabrication of vertically aligned Si nanowires and their application in a gated field emission device, Applied Physics Letters. v; 88. article # 013112. (2006)†.

(56) References Cited

OTHER PUBLICATIONS

Small, et al. Modulation of thermoelectric power of individual carbon nanotubes. Physical Review letters, vol. 91, pp. 256801-1 to 256801-4. (2003)†.
Snyder, et al. Thermoelectric microdevice fabricated by a MEMS-like electrochemical process. nature Material, vol. 2, pp. 528-531. (2003)†.
Tao, et al. Langrfluir Blodgett Silver nanowire Monolayers for Molecular Sensing Using Surface-Enhanced Raman Spectroscopy. nanoLetters 3, 1229. (2003)†.
Trzcinski, et al. Quenched Phonon Drag in Silicon Microcontacts. Physical Review Letters, vol. 56, No. 10, pp. 1086-1089. (1986)†.
Venkatasubramanian, et al. Thin-film thermoelectric devices with high room-temperature figures of merit. nature, vol. 413, pp. 597-602. (2001)†.
Vining. Desperately seeking silicon, nature, vol. 451, pp. 132-133, (2008)†.
Vossmeyer, et al. Light-directed assembly of nanoparticles, Angew. Chem. Int. Ed. Engl. 36: pp. 1080-1083. (1997)†.
Wang, et al. Complementary Symmetry Silicon nanowire Logic: Power-Efficient Inverters with Gain, Small, 2: pp. 1153-1158. (2006)†.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871.(2005)†.
Wang, et al. Surface Chemistry and Electrical Properties of Germanium nanowires, JACS, 126: pp. 11602-11611, (2004)†.
Wang, et al. Use of phopshine as an n-type dopant source for vapor-liquid-solid growth of silicon nanowires. nano Letters. 5(11):2139-2143. (2005)†.
Wang, et al., Silicon p-FETs from Ultrahigh Density nanowire Arrays, nano Letters. 6: 1096-1100. (2006)†.
Weber, et al. Silicon-nanowire transistors with intruded nickel-Silicide Contacts. nano Letters v. 6, pp. 2660-2666. (2006)†.
Weber, et al. Transport properties of silicon. Applied Physics A: Solids and Surfaces, pp. 136-140. (1991)†.
Whang, et al. Large-Scale Hierarchical Organization of nanowire Arrays for Integrated nanosystems. nanoLetters 3, pp. 1255-1259. (2003)†.
Williams, et al. Etch rates for micromachining processing. Journal of Microelectromechanical Systems 5, pp. 256-269. (1996)†.
Wu, et al. Single-crystal metallic nanowires and meta semiconductor nanowires heterostructures. nature, 430. p. 61. (2004)†.
Xu, et al. Controlled fabrication of long quasione-dimensional superconducting nanowire arrays. nano letters, vol. 8, No. 1. pp. 136-141. (2007)†.
Yablonovitch. Photonic band-gap structures, J. Opt. Soc. Am. B., 10: pp. 283-297. (1993)†.
Yang, et al. Encoding Electronic Properties.by Synthesis of Axial Modulation Doped Silicon nanowires. Science, 310, p. 1304. (2005)†.
Yang, et al. Single p-TypelIntrinsic/n-TypeSilicon nanowires as nanoscale Avalanche Photodetectors, nano Letters, 6:2929-2934. (2006)†.
Yu, et al. Reduction of thermal conductivity in phononic nanomesh structures. nature nanotechnology. 5. pp. 718-721 (2010)†.
Yu-Ming, et al. Semimetal-semicinductor transition in bil_xSbx alloy nanowires and their thermoelectric properties. Applied Physics Letter, Volov. 61, No. 13, pp. 2403-2405. (2002)†.
Zener, et al. Internal friction in solids III. Experimental demonstration of thermoelastic internal friction. Physical Review 53, pp. 100-101. (1938)†.
Zener. Internal friction in solids I. Theory of internal friction in reeds. Physical Review 52, pp. 230-235. (1937)†.
Zhong, et al. Nanowire Crossbar Arrays as Address Decoders for Integrated nanosystems. Science. 302. pp. 1377-1379. (2003)†.
Zhou, et al. Verticaly aligned Zn2SiO4 nanotube/ZnO nanowire Heterojunction Arrays. Small, v.3. p. 622-626. (2007)†.

Zhou. Determination of transport properties in chromium disilicide nanowires via combined thermoelectric and structural characterizations. nano Letters 7, 1649-1654. (2007)†.
Chen, et al. "Dispenser Printed Microscale Thermoelectric Generators for Powering Wireless Sensor Networks." Paper No. IMECE2009-11636, pp. 343-352. (2009)†.
European Search Report and Opinion dated Feb. 26, 2016 for EP Application No. 13829134.9.†.
Notice of Allowance dated Jan. 22, 2016 for U.S. Appl. No. 14/667,177.†.
Notice of Allowance dated Oct. 8, 2015 for U.S. Appl. No. 14/667,177.†.
Notice of Allowance dated Nov. 6, 2015 for U.S. Appl. No. 14/667,177.†.
Notice of Allowance dated Dec. 10, 2015 for U.S. Appl. No. 14/667,177.†.
Office Action dated Nov. 17, 2015 for U.S. Appl. No. 14/372,443.†.
Office Action dated Nov. 18, 2015 for U.S. Appl. No. 13/278,074.†.
Wolfsteller; et al., "Comparison of the top-down and bottom-up approach to fabricate nanowire-based silicon/germanium heterostructures," Thin Solid Films 518.9. pp. 2555-2561. (2010)†.
Notice of Allowance dated Jun. 15, 2016 for U.S. Appl. No. 13/278,074.†.
Office Action dated Jun. 23, 2016 for U.S. Appl. No. 14/372,443.†.
Office Action dated Jun. 28, 2016 for U.S. Appl. No. 14/624,506.†.
Notice of Allowance dated Jul. 29, 2016 for U.S. Appl. No. 14/624,506.†.
Weblement Periodic Table, Silicon the essentials, Downloaded from https://www.webelements.com/silicon/ on Aug. 12, 2015.†.
Non-Final Office Action issued by the United States Patent and Trademark Office dated Jun. 16, 2015 in U.S. Appl. No. 13/278,074.†.
Notice of Allowance issued by the United States Patent and Trademark Office dated Jul. 29, 2015 in U.S. Appl. No. 12/175,027.†.
International Search Report and Written Opinion dated Jul. 3, 2015 in PCT Application No. PCT/US2015/022312.†.
Silverstein, et al. Porous polymers. John Wiley & Sons, Inc. Publication. pp. 1-455 (2011).†.
Heat sinks heat spreaders pettier coolers, novel concepts, Inc., 2014, Available at novelconceptsinc.com http://www.novelconceptsinc.com/heat-spreaders.htm, accessed on Aug. 21, 2017, 2 pages.
Extended European Search Report and Search Opinion dated Oct. 9, 2017 for European Patent Application No. EP 15768608.0.
Advisory action dated Jul. 21, 2017 for U.S. Appl. No. 14/372,443.
International search report and written opinion dated Apr. 7, 2017 for PCT Application No. US-201664501.
Notice of allowance dated Aug. 18, 2017 for U.S. Appl. No. 14/700,082.
Office action dated Feb. 2, 2017 for U.S. Appl. No. 14/700,082.
Office action dated Feb. 12, 2015 for U.S. Appl. No. 13/550,424.
Office action dated Apr. 19, 2017 for U.S. Appl. No. 14/372,443.
Office action dated Jun. 26, 2017 for U.S. Appl. No. 14/989,225.
Office action dated Jun. 29, 2016 for U.S. Appl. No. 13/550,424.
International search report and written opinion dated Aug. 7, 2017 for PCT Application US-201730868.
Office action dated Aug. 28, 2015 for U.S. Appl. No. 13/550,424.
Office action dated Oct. 7, 2016 for U.S. Appl. No. 14/989,225.
Office Action dated Jan. 16, 2018 for U.S. Appl. No. 14/989,225.
Office Action dated Jan. 17, 2018 for U.S. Appl. No. 14/372,443.
Notice of Allowance dated Sep. 6, 2017 for U.S. Appl. No. 14/700,082.
Notice of Allowance dated Jan. 26, 2018 for U.S. Appl. No. 29/584,211.
Notice of Allowance dated Mar. 1, 2018 for U.S. Appl. No. 14/700,082.
Notice of Allowance dated Mar. 19, 2018 for U.S. Appl. No. 29/584,211.
Notice of Allowance dated Mar. 30, 2018 for U.S. Appl. No. 14/700,082.
Notice of Allowance dated May 4, 2018 for U.S. Appl. No. 14/700,082.
Notice of Allowance dated Sep. 25, 2018 for U.S. Appl. No. 14/372,443.

(56) References Cited

OTHER PUBLICATIONS

Boukai, Akram Issam, "Thermoelectric Properties of Bismuth and Silicon Nanowires," Doctor of Philosophy Dissertation, California Institute of Technology, Pasadena, California (2008).†.
Huang, Zhipeng, et al., "Metal-Assisted Chemical Etching of Silicon: A Review," Advanced Materials, vol. 23, No. pp. 285-308 (2011) (available online Sep. 21, 2010).†.
Lee, Eugene, et al., "Nanostructured Bulk Thermoelectric Materials and Their Properties," 24th International Conference on Thermoelectrics (ICT) (2005) and Abstract (5 pages).†.
Lee, et al., "Nanoporous Si as an Efficient Thermoelectric Material," Nano Letters, 8(11), 2008, pp. 3750-3754.
Prasher, "Thermal conductivity of composites of aligned nanoscale and microscale wires and pores," Journal of Applied Physics, 100, 034307, 2006, pp. 1-9.
Majumdar, Arun, "Thermoelectricity in Semiconductor Nanostructures," Science, vol. 303, No. 5659, pp. 777-778 (Feb. 6, 2004).†.
Silverstein, Michael S., et al., eds., Porous Polymers (Apr. 2011) (Abstract only) (1 page).†.
Tang, Jinyao, et al., "Holey Silicon as an Efficient Thermoelectric Material," Nano Letters, vol. 10, pp. 4279-4283 (2010) (available online Sep. 14, 2010).†.
Wang, Wei, et al., "A new type of lower power thermoelectric micro-generator fabricated by nanowire array thermoelectric material," Microelectronic Engineering, vol. 77, pp. 223-229 (2005) (available online Nov. 26, 2004).†.
Yang, et al., "Thermal conductivity of simple and tubular nanowire composites in the longitudinal direction," Physical Review B, 72, 125418, 2005, pp. 1-7.
International Search Report and Written Opinion of the International Searching Authority dated Nov. 30, 2012 for PCT Application No. PCT/US2012/047021.†.
International Preliminary Report on Patentability dated Jan. 21, 2014 for PCT Application No. PCT/US2012/047021.†.
Agnes, et al. Doping of the nanocrystailine semiconductor zinc oxide with the donor indium, Amer Institute of Phystcs, vol. 83, No. 6, 1204. (2003)†.
Beckman, et al. Fabrication of Conducting. Silicon nanowire Arrays, J. Appi. Phys. 96 (10), 5921-5923. (2004)†.
Beckman, et al., Bridging Dimensions: Demultiplexing Ultrahigh-Density nanowire Circuits, Science, 310: 465-468. (2005)†.
Behnen, Quantitative examination of the thermoelectric power of n-typesilicon in the phono drag regime.Journal of Applied Physics, vol. 67, pp. 287-292. (1990)†.
Bera, et al. Marked Effects of Alloying on the Thermal Conductivity of nanoporous Materials, American Physical Society Physical Review Letters, 104, pp. 115502-01 to 115502-4. (2010)†.
Boukai, et al. Silicon nanowires as efficient thermoelectric materials. nature, vol. 451, pp. 168-171. (2008)†.
Boukai, et al. Size-Dependent transport and thermoelectric properties of individual polycrystalline bismuth nanowires. Advanced Materials, 16, pp. 864-869, (2006)†.
Bunimovich, et al. Quantitative Real-Time Measurements of DnA Hybridization with Alkylated nonoxidized Silicon nanowires in Electrolyte Solution, JAGS, 128: 16323-16331. (2006)†.
Chadwick, et al. Plane waves in an elastic solid conducting heat. Journal of the Mechanics and Physics of Solids 6, 223-230. (1958)†.
Chen, et al. Recent developments in thermoelectric materials. International Materials Reviews, vol. 48, pp. 45-66. (2003)†.
Choi, et al. Fabrication of bismuth nanowires with a silver nanocrystal shadowmask, J. Vac. Sci. Tech. A-Vac. Surf. and Films, 18, 1236, 1328. (2000)†.
Choi, et al. Fabrication of nanometer size photoresist wire patterns With a silver nanocrystal shadowmask. J. Vac. Sci. & Tech. A-Vac. Surf. and Films, 17, 1425. (1999)†.
Chung, et al. Fabrication and Alignment of Wires in Two-Dimensions. The Journal of PhysiCal Chemistry B. 102. 6685. (1998)†.
Collier, et al. Nanocrystal superlattices. Annu. Rev. Phys. Chem. 49: 371-404. (1998)†.

Deresiewicz, Plane waves in a thermoelastic solid. Journal of the Acoustical Society of America 29, 204-209. (1957)†.
Diehl, et al. Self-Assembly of Deterministic Carbon nanottibe Wiring networks. Angew. Chem. Int Ed. 41, 353. (2002)†.
European search report and opinion dated Mar. 25, 2014 for EP Application No. 11835180.8.
Fan, et al. Self-Oriented Regular Arrays of Carbon nanotubes and their Field Emission Devices. Science, v. 283, p. 512. (1999)†.
Geballe, et al. Seebeck Effect in Silicon. Physical Review, vol. 98, pp. 940-947. (1955)†.
Green, et al., A 160-kilobit molecular electronic memory patterned at 1011 bits per square centimeter, nature, 445: 414-417. (2007)†.
Gurevich. Thermoelectric properties of conductors J. Phys. (U.S.S.R.) 9, 477. (1945)†.
Harman, et al. Quantum dot superiattice thermoelectric materials and devices, Science, vol. 297, pp. 2229-2232, (2002)†.
Haynes, et al. nanosphere Lithography: A Versatile nanofabrication Tool for Studies of Size-Dependent nanoparticle Optics. J. Phys. Chem. B, 105, 5599-5611. (2001)†.
Heath, et al. A Defect-Tolerant Computer Architecture: Opportunities for nanotechnology, Science, 280: 1716 -1721. (1998)†.
Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B, 101: 189-197. (1997)†.
Herring, Theory of the thermoelectric power of semiconductors. Physical Review, vol. 96, No. 5, pp. 1163-1187. (1954)†.
Hicks, et al.. Thermoelectric figure of merit of a one-dimensional conductor. Physical Review B 47, 1 6631-1 6634. (1993)†.
Hochbaum, et al. Enchanced thermoelectric performance of rough silicon nanowires, nature Publishing Group, vol. 451, pp. 1-6. (2008)†.
Hsu, et al. Cubic AgPbmSbTe2+m: Bulk thermoelectric materials with high Figure of Merit. Science, vol. 303, pp. 818-821. (2004)†.
Huang, et al. Spontaneous formation of nanoparticle strip patterns through dewetting. nature Materials vol. 4, p. 896. (2005)†.
Hulteen, et al. nanosphere lithography: A materials general fabrication process for periodic particle array surfaces, J. Vac. Sci. Technol. 13: 1553-1558. (1995)†.
Humphrey, et al. Reversible thermoelectric nanomaterials. Physical Review Letters 94, 096601. (2005)†.
Husain, et al. Nanowire-based very-high-frequency electromechanical resonator, Applied physics letters, vol. 83, No. 6, pp. 1240-1242. (2003)†.
Ihab, et al. Manipulation of thermal phonons: a phononic crystal route to high-ZT thermoelectrics. Photonic and Phononic Properties of Engineered nanostructures, SPIE. 1000 20th ST, Bellingham, WA 98225-6705. pp. 7946:1-9. (2011)†.
International search report and written opinion dated Feb. 9, 2009 for PCT/US2008/070309.†.
International search report and written opinion dated Apr. 15, 2009 for PCT/US2008/064439.†.
International search report and written opinion dated Apr. 26, 2013 for PCT/US2013/021900.†.
International search report and written opinion dated May 29, 2012 for PCT/US2011/057171.†.
Co-pending U.S. Appl. No. 16/227,264, filed Dec. 20, 2018.
Co-pending U.S. Appl. No. 16/548,633, filed Aug. 22, 2019.
EP16871537.3 European Search Report dated May 28, 2019.
Marthur, et al., Thermoelectric power in porous silicon, Journal of Applied Physics, Jun. 1, 1998, 83(11):5855-5857.
PCT/US2019/017898 International Search Report and Written Opinion dated Apr. 23, 2019.
PCT/US2019/017900 International Search Report and Written Opinion dated Apr. 23, 2019.
U.S. Appl. No. 14/624,506, filed Feb. 17, 2015.
U.S. Appl. No. 14/667,177, filed Mar. 24, 2015.
U.S. Appl. No. 14/700,082, filed Apr. 29, 2015.
U.S. Appl. No. 15/958,231 Office Action dated Jun. 17, 2019.
U.S. Appl. No. 15/982,672 Office Action dated Apr. 8, 2019.
Wallarah Minerals, Downloaded Mar. 26, 2015. http://www.wallarahminerals.com.au/high-temperature-seebeck-probes.htm.

(56) References Cited

OTHER PUBLICATIONS

2010 NNIN (Nanoscale Science, Engineering & Technology) REU Convocation, University of Minnesoita (Aug. 11-14, 2010), 51 pages.
Sialon Ceramics. Downloaded May 6, 2013. http://www.sailon.com.au/high-temperature-seebeck-probes.htm.

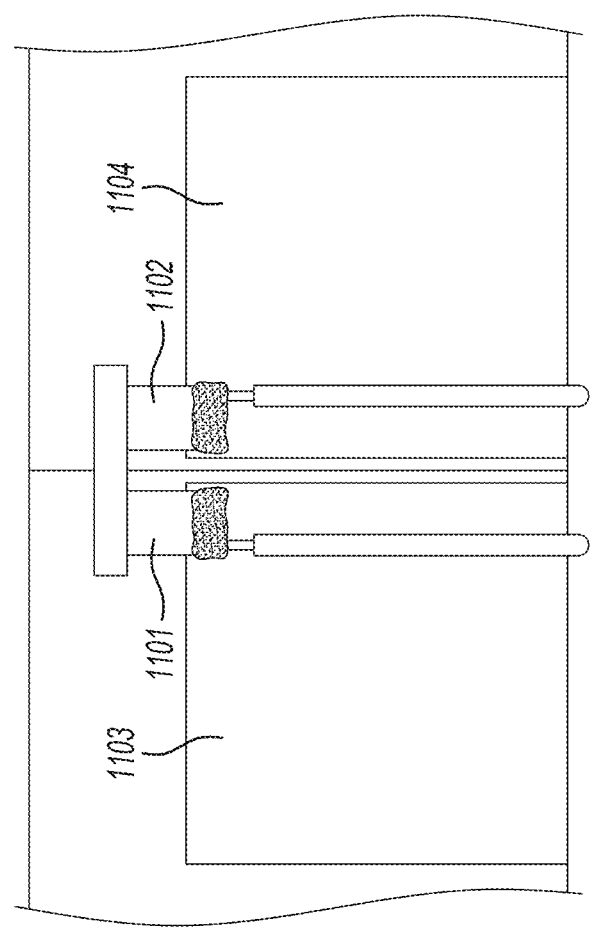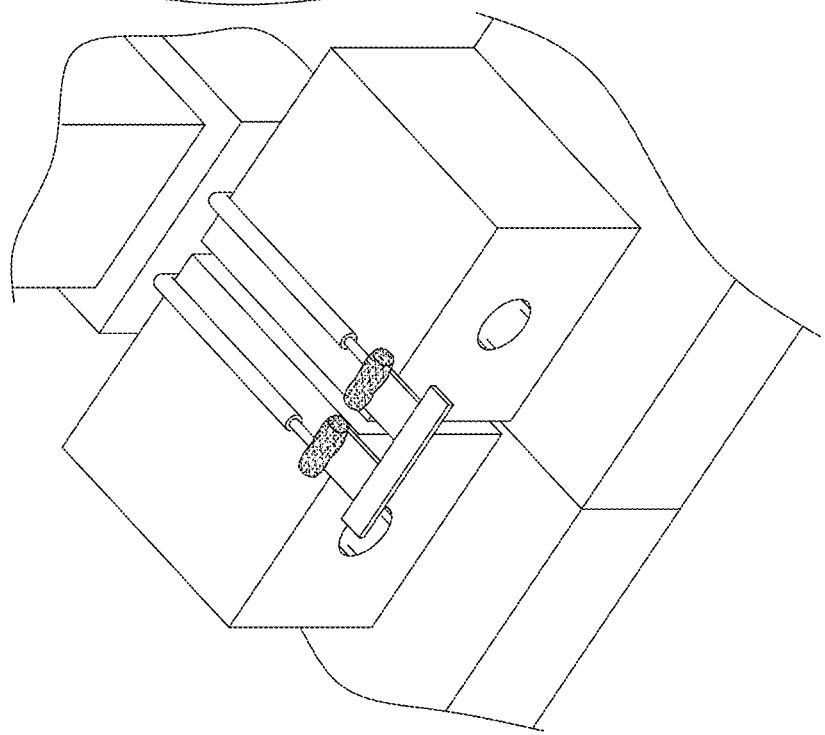
FIG. 11

THERMOELECTRIC DEVICES, SYSTEMS AND METHODS

CROSS-REFERENCE

This application is a divisional of U.S. patent application Ser. No. 13/550,424, filed Jul. 16, 2012, which claims priority to U.S. Provisional Patent Application No. 61/508,798, filed Jul. 18, 2011, and U.S. Provisional Patent Application No. 61/565,440, filed Nov. 30, 2011, which are entirely incorporated herein by reference.

BACKGROUND

Over 15 Terawatts of heat is lost to the environment annually around the world by heat engines that require petroleum as their primary fuel source. This is because these engines only convert about 30 to 40% of petroleum's chemical energy into useful work. Waste heat generation is an unavoidable consequence of the second law of thermodynamics.

The term "thermoelectric effect" encompasses the Seebeck effect, Peltier effect and Thomson effect. Solid-state cooling and power generation based on thermoelectric effects typically employ the Seebeck effect or Peltier effect for power generation and heat pumping. The utility of such conventional thermoelectric devices is, however, typically limited by their low coefficient-of-performance (COP) (for refrigeration applications) or low efficiency (for power generation applications).

Thermoelectric device performance may be captured by a so-called thermoelectric figure-of-merit, $Z=S^2\sigma/k$, where 'S' is the Seebeck coefficient, '$\sigma$' is the electrical conductivity, and 'k' is thermal conductivity. Z is typically employed as the indicator of the COP and the efficiency of thermoelectric devices—that is, COP scales with Z. In some cases, a dimensionless figure-of-merit. ZT, is employed, where 'T' can be an average temperature of the hot and the cold sides of the device.

Applications of conventional semiconductor thermoelectric coolers are rather limited, as a result of a low figure-of-merit, despite many advantages that they provide over other refrigeration technologies. In cooling, low efficiency of thermoelectric devices made from conventional thermoelectric materials with a small figure-of-merit limits their applications in providing efficient thermoelectric cooling.

SUMMARY

Recognized herein is a need for enhanced thermoelectric materials, and methods for their fabrication. More particularly, there is a need for thermoelectric materials exhibiting an enhanced figure-of-merit.

A thermoelectric device may include a semiconductor substrate having a mesh (e.g., a plurality of holes) disposed between electrodes of the thermoelectric device. The holes of the mesh can have dimensions on the order of nanometers. In some cases, the holes can be filled with a metallic material, semiconductor, or insulator to provide inclusions. The inclusions can have dimensions on the order of nanometers.

In some cases, a thermoelectric device can include a semiconductor substrate and an array of nanostructures, such as wires or holes. The wires or holes may have dimensions on the order of nanometers, e.g., nanowires or nanoholes. The nanostructures can have a high aspect ratio and can be monodisperse. In some cases, the nanostructures are anchored to a semiconductor substrate, such as a silicon substrate.

The performance of a thermoelectric device of the disclosure may be related to the properties and characteristics of holes and/or wires of thermoelectric elements of the device. In some cases, optimum device performance may be achieved for an element having holes or wires, an individual hole or wire having a surface roughness between about 0.1 nm and 50 nm, or 1 nm and 20 nm, or 1 nm and 10 nm, as measured by transmission electron microscopy (TEM). In some cases, a thermoelectric element may have a metal content between about 0.000001% and 25%, as measured by x-ray photoelectron spectroscopy (XPS). Such a metal may be adsorbed on a surface of the thermoelectric elements, such as exposed surfaces of holes or wires of the thermoelectric element.

In one aspect, a method for forming a thermoelectric device is provided that comprises forming a mask adjacent to a substrate, the mask having three-dimensional structures distributed or otherwise provided within a polymer matrix. In some cases, the thermoelectric device can include one or more intervening layers (e.g., oxide layer(s)) between the mask and the substrate. In some cases, the three-dimensional structures may be phase-separated in the polymer matrix. The three-dimensional structures or the polymer matrix is then removed to expose portions of the substrate. Next, an etching layer is deposited adjacent to exposed portions of the substrate. The etching layer may include an etching material, such as a metallic material. The substrate is then catalytically etched using an oxidizing agent and an etchant. In an embodiment, the three-dimensional structures are selectively removed in relation to the polymer matrix. In another embodiment, catalytically etching the substrate forms holes in the substrate. In another embodiment, an etch block layer is deposited on exposed portions of the substrate before depositing the etching layer, and the mask is removed. In another embodiment, the etch block layer comprises a material that reduces an etch rate of portions of the substrate that are adjacent to the etch block layer. In another embodiment, the etch block layer comprises chromium, molybdenum, tungsten, titanium, niobium, or combinations thereof. In another embodiment, catalytically etching the substrate forms wires in the substrate. In another embodiment, catalytically etching the substrate forms holes in the substrate. In another embodiment, the etching layer comprises gold, silver, platinum, chromium, molybdenum, tungsten, palladium, and/or other noble metals. In some embodiments, the etching layer comprises any combinations or alloys of gold, silver, platinum, chromium, molybdenum, tungsten, palladium, and/or other noble metals. In another embodiment, the three-dimensional structures are formed of a polymeric material. In another embodiment, the three-dimensional structures are formed of a block copolymer. In another embodiment, the mask is removed to expose portions of the substrate. In another embodiment, the substrate comprises one or more semiconductors. In another embodiment, the substrate comprises a layer of one or more semiconductors and one or more intervening layers adjacent to the layer.

In yet another aspect of the present disclosure, a method for forming a thermoelectric device comprises providing a polymer matrix adjacent to a substrate, the polymer matrix having three-dimensional structures phase-separated therein. Next, one of the three-dimensional structures and the polymer matrix is selectively removed in relation to the other to provide a mask that includes (i) a plurality of holes in the polymer matrix or (ii) the three-dimensional structures disposed adjacent to the substrate. The mask exposes portions of the substrate. The mask has a pattern that is characterized by the distribution of the plurality of holes or three-dimensional structures. Next, the pattern is catalytically transferred to the substrate. In an embodiment, the pattern includes a plurality of holes, and catalytically transferring the pattern to the substrate generates holes in the substrate. In another embodiment, the pattern includes the three-dimensional structures, and catalytically transferring the pattern to the substrate generates wires in the substrate. In another embodiment, catalytically transferring the pattern to the substrate comprises depositing a layer of an etching material adjacent to exposed portions of the substrate, and, with the aid of the etching material, catalytically etching the substrate using an oxidizing agent and an etchant. In another embodiment, the method further comprises depositing a layer of an etch block material adjacent to the substrate prior to depositing the layer of the etching material. In another embodiment, an etch rate of portions of the substrate adjacent to the etching material is greater than an etch rate of portions of the substrate adjacent to the etch block material. In another embodiment, the etch block material comprises chromium, molybdenum, tungsten, titanium, niobium, or combinations thereof. In another embodiment, catalytically etching the substrate forms wires from the substrate. In another embodiment, catalytically etching the substrate forms holes in the substrate. In another embodiment, the layer of etching material comprises gold, silver, platinum, chromium, molybdenum, tungsten, palladium, and/or other noble metals. In certain embodiments, the metallic material may comprise any combinations or alloys of gold, silver, platinum, chromium, molybdenum, tungsten, palladium, and/or other noble metals. In another embodiment, the three-dimensional structures are formed of a polymeric material. In another embodiment, the three-dimensional structures are formed of a block copolymer. In another embodiment, catalytically transferring the pattern to the substrate comprises removing the mask. In another embodiment, the substrate comprises one or more semiconductors.

In another aspect, a method for forming a thermoelectric device comprises providing a pattern of holes or wires adjacent to a substrate. Next, the substrate is catalytically etched to transfer the pattern to the substrate to form wires or holes in the substrate. Each of the wires or holes may have an aspect ratio of at least about 20:1. The etch rate of the substrate is optionally at least about 0.1 nanometers (nm) per second at 25° C. In an embodiment, the substrate comprises one or more semiconductors (e.g., silicon). In another embodiment, the etch rate is at least about 1 nm per second at 25° C. In another embodiment, the etch rate is at least about 10 nm per second at 25° C.

In another aspect, a method for forming a thermoelectric device is provided that comprises forming a mask adjacent to a substrate. The mask includes three-dimensional structures distributed or otherwise provided in a polymer matrix. The polymer matrix is then removed to provide a plurality of free-standing three-dimensional structures adjacent to the substrate and exposing portions of the substrate. A layer of a metallic material is then deposited adjacent to the mask and exposed portions of the substrate. Next, the free-standing three-dimensional structures are removed. The metallic material is then exposed to an oxidizing agent and an etchant to form cylinders from the substrate. The metallic material may catalyze the etching of the substrate upon exposure to the oxidizing agent and the etchant.

In another aspect, a method for forming a thermoelectric device is provided that comprises forming a mask adjacent to a substrate, the mask having three-dimensional structures phase-separated in a polymer matrix. The three-dimensional structures are then removed to form a plurality of holes in the polymer matrix exposing portions of the substrate. Next, a layer of an etch block material is deposited adjacent to the mask and exposed portions of the substrate. The mask is then removed. Next, a layer of a metallic material is deposited on the substrate and the layer of the etch block material. The layer of the metallic material is then exposed to an oxidizing agent and an etchant to form cylinders from the substrate.

In another aspect of the present disclosure, a method for forming a thermoelectric device comprises providing, adjacent to a substrate, a polymer matrix having three-dimensional structures distributed or otherwise provided therein. One of the polymer matrix or the three-dimensional structures is then removed to provide a mask having a pattern of holes or the three-dimensional structures disposed adjacent to the substrate. In some cases, one of the polymer matrix or the three-dimensional structures is selectively removed in relation to the other. The mask may expose portions of the substrate. A layer of an etching material is then deposited adjacent to the substrate. The layer of the etching material may be deposited on the mask and exposed portions of the substrate. The substrate is catalytically etched with the aid of the etching material. The substrate may be etched by exposing the etching material to an oxidizing agent and an etchant. In an embodiment, the substrate comprises one or more semiconductors. In another embodiment, the three-dimensional structures are phase-separated in the polymer matrix. In another embodiment, the polymer matrix is selectively removed in relation to the three-dimensional structures. In another embodiment, catalytically etching the substrate forms holes in the substrate. In another embodiment, before depositing the layer of the etching material, a layer of an etch block material is deposited adjacent to the substrate. In another embodiment, the three-dimensional structures are selectively removed in relation to the polymer matrix to provide a pattern of holes, and wherein the second layer is deposited in an individual hole of the holes. In another embodiment, catalytically etching the substrate forms wires in the substrate. In another embodiment, catalytically etching the substrate forms holes in the substrate. In another embodiment, the layer of the etching material comprises gold, silver, platinum, chromium, molybdenum, tungsten, palladium, and/or other noble metals. In certain embodiments, the metallic material may comprise any combinations or alloys of gold, silver, platinum, chromium, molybdenum, tungsten, palladium, and/or other noble metals. In another embodiment, the layer of the etch block material comprises chromium, molybdenum, tungsten, titanium, niobium, or combinations thereof. In another embodiment, the three-dimensional structures are formed of a polymeric material. In another embodiment, the three-dimensional structures are formed of a block copolymer.

In yet another aspect of the present disclosure, a thermoelectric device comprises a first thermoelectric element electrically coupled to a second thermoelectric element. Each of the first and second thermoelectric elements includes a semiconductor substrate that is doped p-type or n-type. The semiconductor substrate of each of the first and second thermoelectric elements comprises a pattern of holes, an individual hole of the pattern having an aspect ratio of at least about 20:1. In an embodiment, the holes are oriented anti-parallel in relation to an electrode coupled to the substrate. In another embodiment, the holes are oriented perpendicularly in relation to the electrode. In another embodiment, the pattern of holes is monodisperse. In another embodiment, an individual hole has a surface with a metal content of at least about 0.000001% as measured by x-ray photoelectron spectroscopy (XPS). In another embodiment, an individual hole has a surface roughness between about 0.5 nanometers (nm) and 50 nm as measured by transmission electron microscopy (TEM). In another embodiment, the surface roughness is between about 1 nm and 20 nm as measured by TEM. In another embodiment, the surface roughness is between about 1 nm and 10 nm as measured by TEM. In another embodiment, exposed surfaces of the hole comprise an oxide of the semiconductor substrate. In another embodiment, the oxide is a native oxide. In another embodiment, the semiconductor substrate comprises silicon. In another embodiment, the aspect ratio is at least about 50:1. In another embodiment, the aspect ratio is at least about 100:1. In another embodiment, the aspect ratio is at least about 1,000:1. In another embodiment, the aspect ratio is at least about 5,000:1. In another embodiment, the aspect ratio is at least about 10,000:1. In another embodiment, the aspect ratio is at least about 100,000:1. In another embodiment, the pattern of holes has a pitch less than about 1000 nanometers. In another embodiment, the pattern of holes has a pitch less than about 100 nanometers. In another embodiment, the pattern of holes has a pitch less than about 20 nanometers. In another embodiment, an individual hole is filled with a dielectric material. In another embodiment, the first and second thermoelectric elements are oppositely doped n-type or p-type.

In another aspect of the present disclosure, a thermoelectric device comprises a first thermoelectric element formed of an n-type or p-type semiconductor substrate, and a second thermoelectric element electrically coupled to the first thermoelectric element and formed of an n-type or p-type semiconductor substrate. The semiconductor substrate of each of the first and second thermoelectric elements comprises a pattern of holes or wires. An individual hole or wire of the pattern optionally has an aspect ratio of at least about 20:1 and a surface roughness between about 0.5 nanometers (nm) and 50 nm as measured by transmission electron microscopy (TEM). In an embodiment, the pattern of holes or wires is monodisperse. In another embodiment, an individual hole or wire has a surface with a metal content of at least about 0.000001% as measured by x-ray photoelectron spectroscopy (XPS). In another embodiment, the surface roughness is between about 1 nm and 20 nm as measured by TEM. In another embodiment, the surface roughness is between about 1 nm and 10 nm as measured by TEM. In another embodiment, exposed surfaces of the semiconductor substrate comprise an oxide of the semiconductor substrate. In another embodiment, the oxide is a native oxide. In another embodiment, the semiconductor substrate comprises silicon. In another embodiment, the aspect ratio is at least about 50:1. In another embodiment, the aspect ratio is at least about 100:1. In another embodiment, the aspect ratio is at least about 1,000:1. In another embodiment, the aspect ratio is at least about 5,000:1. In another embodiment, the aspect ratio is at least about 10,000:1. In another embodiment, the aspect ratio is at least about 100,000:1. In another embodiment, the pattern of holes or wires has a pitch less than about 1000 nanometers. In another embodiment, the pattern of holes or wires has a pitch less than about 100 nanometers. In another embodiment, the pattern of holes or wires has a pitch less than about 20 nanometers. In another embodiment, at least one of the first and second thermoelectric elements has a pattern of holes. In another embodiment, the first and second thermoelectric elements each have a pattern of holes. In another embodiment, an individual hole of the pattern of holes is filled with a dielectric material. In another embodiment, at least one of the first and second thermoelectric elements has a pattern of wires. In another embodiment, the first and second thermoelectric elements each have a pattern of wires. In another embodiment, individual wires of the pattern of wires are laterally separated by a dielectric material. In another embodiment, the first and second thermoelectric elements are oppositely doped n-type or p-type.

In another aspect, a thermoelectric element is provided comprising a semiconductor substrate that is doped p-type or n-type and includes a pattern of holes or wires. An individual hole or wire of the pattern can have an aspect ratio of at least about 20:1 and a surface roughness between about 0.5 nanometers (nm) and 50 nm as measured by transmission electron microscopy (TEM). In an embodiment, the pattern of holes or wires is monodisperse. In another embodiment, an individual hole or wire has a surface with a metal content of at least about 0.001% as measured by x-ray photoelectron spectroscopy (XPS). In another embodiment, the surface roughness is between about 1 nm and 20 nm as measured by TEM. In another embodiment, the surface roughness is between about 1 nm and 10 nm as measured by TEM. In another embodiment, exposed surfaces of the semiconductor substrate comprise an oxide of the semiconductor substrate. In another embodiment, the oxide is a native oxide. In another embodiment, the semiconductor substrate comprises silicon. In another embodiment, the aspect ratio is at least about 50:1. In another embodiment, the aspect ratio is at least about 100:1. In another embodiment, the aspect ratio is at least about 1,000:1. In another embodiment, the aspect ratio is at least about 5,000:1. In another embodiment, the aspect ratio is at least about 10,000:1. In another embodiment, the aspect ratio is at least about 100,000:1. In another embodiment, the pattern of holes or wires has a pitch less than about 1000 nanometers. In another embodiment, the pattern of holes or wires has a pitch less than about 100 nanometers. In another embodiment, the pattern of holes or wires has a pitch less than about 20 nanometers. In another embodiment, the thermoelectric element has a pattern of holes. In another embodiment, an individual hole of the pattern of holes is filled with a dielectric material. In another embodiment, the thermoelectric element has a pattern of wires. In another embodiment, individual wires of the pattern of wires are laterally separated by a dielectric material.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein fully incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 11 shows an experimental setup for conducting bulk measurements of a thermoelectric device, in accordance with an embodiment of the present disclosure;

DETAILED DESCRIPTION

Figure 1:
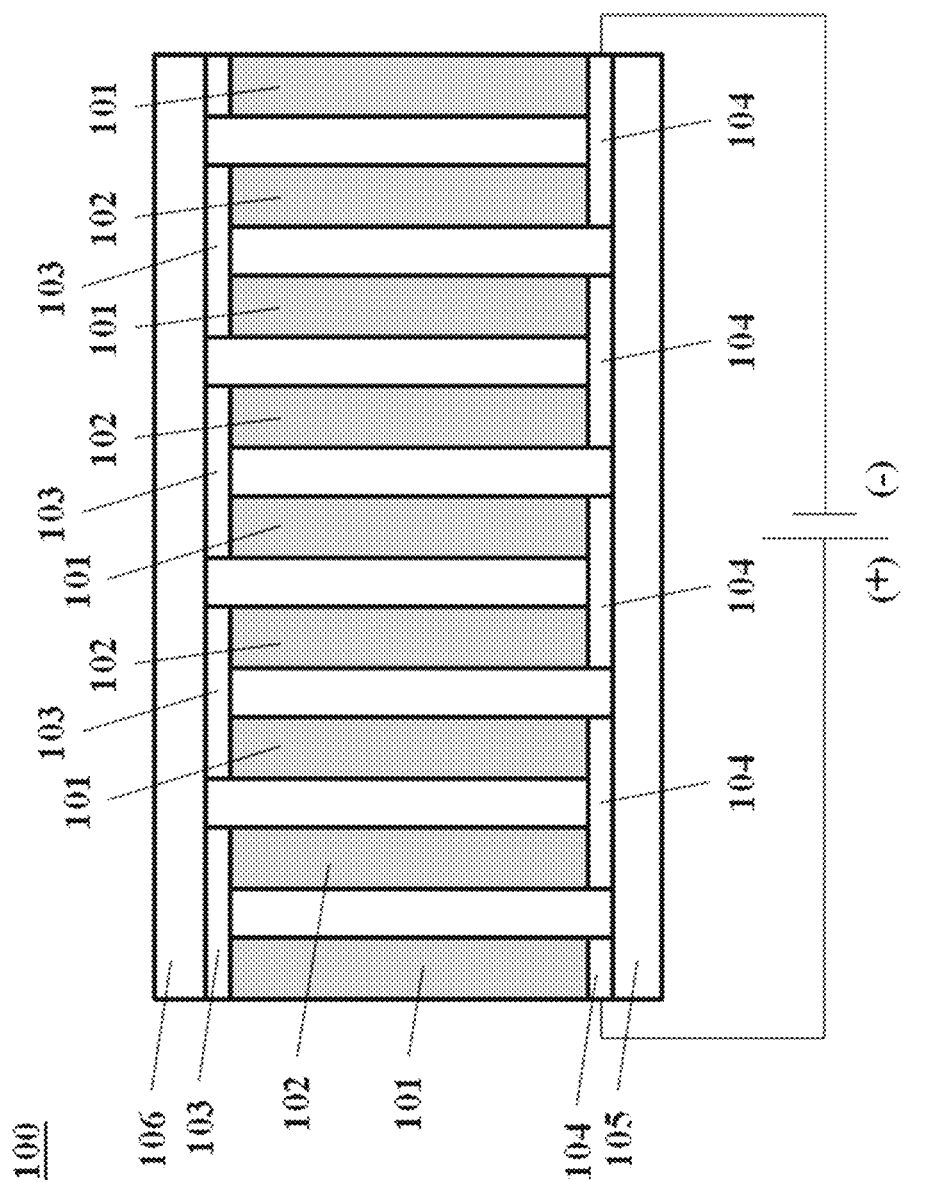
FIG. 1 shows a thermoelectric device.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

Disclosure of ranges herein includes disclosure of all values and further divided ranges within the entire range, including endpoints given for the ranges.

The term "nanostructure," as used herein, generally refers to structures having a first dimension (e.g., width) along a first axis that is less than about 1 micrometer ("micron") in size. Along a second axis orthogonal to the first axis, such nanostructures can have a second dimension from nanometers or smaller to microns, millimeters or larger. In some cases, the first dimension (e.g., width) is less than about 1000 nanometers ("nm"), or 500 nm, or 100 nm, or 50 nm, or smaller. Nanostructures can include holes formed in a substrate material. The holes can together form a mesh having an array of holes. In other cases, nanostructure can include rod-like structures, such as wires, cylinders or box-like structures. The rod-like structures can have circular, elliptical, triangular, square, rectangular, pentagonal, hexagonal, heptagonal, octagonal or nonagonal, or other cross-sections.

The term "nanohole," as used herein, generally refers to a hole, filled or unfilled, having a width or diameter less than about 1000 nanometers ("nm"), or 500 nm, or 100 nm, or 50 nm, or smaller. A nanohole filled with a metallic, semiconductor, or insulating material can be referred to as a "nanoinclusion."

The term "n-type," as used herein, generally refers to a material that is chemically doped ("doped") with an n-type dopant. For instance, silicon can be doped n-type using phosphorous or arsenic.

The term "p-type," as used herein, generally refers to a material that is doped with a p-type dopant. For instance, silicon can be doped p-type using boron or aluminum.

The term "metallic," as used herein, generally refers to a substance exhibiting metallic properties. A metallic material can include one or more elemental metals.

The term "monodisperse," as used herein, generally refers to features having shapes, sizes (e.g., widths, cross-sections, volumes) or distributions (e.g., nearest neighbor spacing, center-to-center spacing) that are similar to one another. In some examples, monodisperse features (e.g., holes, wires) have shapes or sizes that deviate from one another by at most about 20%, 15%, 10%, 5%, 4%, 3%, 2%, 1%, 0.5%, or 0.1%. In some cases, monodisperse features are substantially monodisperse.

The term "etching material," as used herein, generally refers to a material that facilitates the etching of substrate (e.g., semiconductor substrate) adjacent to the etching material. In some examples, an etching material catalyzes the etching of a substrate upon exposure of the etching material to an oxidizing agent and a chemical etchant. The term "etching layer," as used herein, generally refers to a layer that comprises an etching material.

The term "etch block material," as used herein, generally refers to a material that blocks or otherwise impedes the etching of a substrate adjacent to the etch block material. An etch block material may provide a substrate etch rate that is reduced, or in some cases substantially reduced, in relation to a substrate etch rate associated with an etching material. The term "etch block layer," as used herein, generally refers to a layer that comprises an etch block material.

The term "adjacent" or "adjacent to," as used herein, includes "next to," "adjoining," "in contact with," and "in proximity to." In some instances, adjacent components are separated from one another by one or more intervening layers. The one or more intervening layers may have a thickness less than about 10 micrometers ("microns"), 1 micron, 500 nanometers ("nm"), 100 nm, 50 nm, 10 nm, 1 nm, 0.5 nm or less. For example, a first layer adjacent to a second layer can be in direct contact with the second layer.

As another example, a first layer adjacent to a second layer can be separated from the second layer by at least a third layer.

Some embodiments provide thermoelectric devices having thermoelectric elements, each element having an array of nanostructures. Individual thermoelectric elements can be electrically connected to one another. The array of nanostructures is formed by transferring a pattern provided in a template to a substrate adjacent to the template to form a thermoelectric element having the array of nanostructures. The array of nanostructures can include a plurality of holes (e.g., nanoholes) or elongate structures, such as wires (e.g., nanowires).

Thermoelectric Devices

FIG. 1 shows a thermoelectric device 100, in accordance with an embodiment of the present disclosure. The thermoelectric device 100 includes n-type 101 and p-type 102 thermoelectric elements (also "elements" herein) disposed between a first set of electrodes 103 and a second set of electrodes 104 of the thermoelectric device 100. The first set of electrodes 103 connect adjacent n-type 101 and p-type elements, as illustrated.

The electrodes 103 and 104 are in contact with a hot side material 105 and a cold side material 106 respectively. In some embodiments, the hot side material 105 and cold side material 106 are electrically insulating but thermally conductive. The application of an electrical potential to the electrodes 103 and 104 leads to the flow of current, which generates a temperature gradient ($\Delta T$) across the thermoelectric device 100. The temperature gradient ($\Delta T$) extends from a first temperature (average), T1, at the hot side material 105 to a second temperature (average), T2, at the cold side material 106, where T1>T2. The temperature gradient can be used for heating and cooling purposes.

The n-type 101 and p-type 102 elements of the thermoelectric device 100 can comprise or be formed of nanostructures. In some situations, the nanostructures are holes or inclusions, which can be provided in an array of holes (e.g., mesh). In other situations, the nanostructures are rod-like structures, such as nanowires. In some cases, the rod-like structures are laterally separated from one another.

In some cases, the n-type 101 and/or p-type 102 elements are formed of an array of wires or holes oriented along the direction of the temperature gradient. That is, the wires extend from the first set of electrodes 103 to the second set of electrodes 104. In other cases, the n-type 101 and/or p-type 102 elements are formed of an array of holes oriented along a direction that is angled between about 0° and 90° in relation to the temperature gradient. In an example, the array of holes is orthogonal to the temperature gradient.

Figure 2:
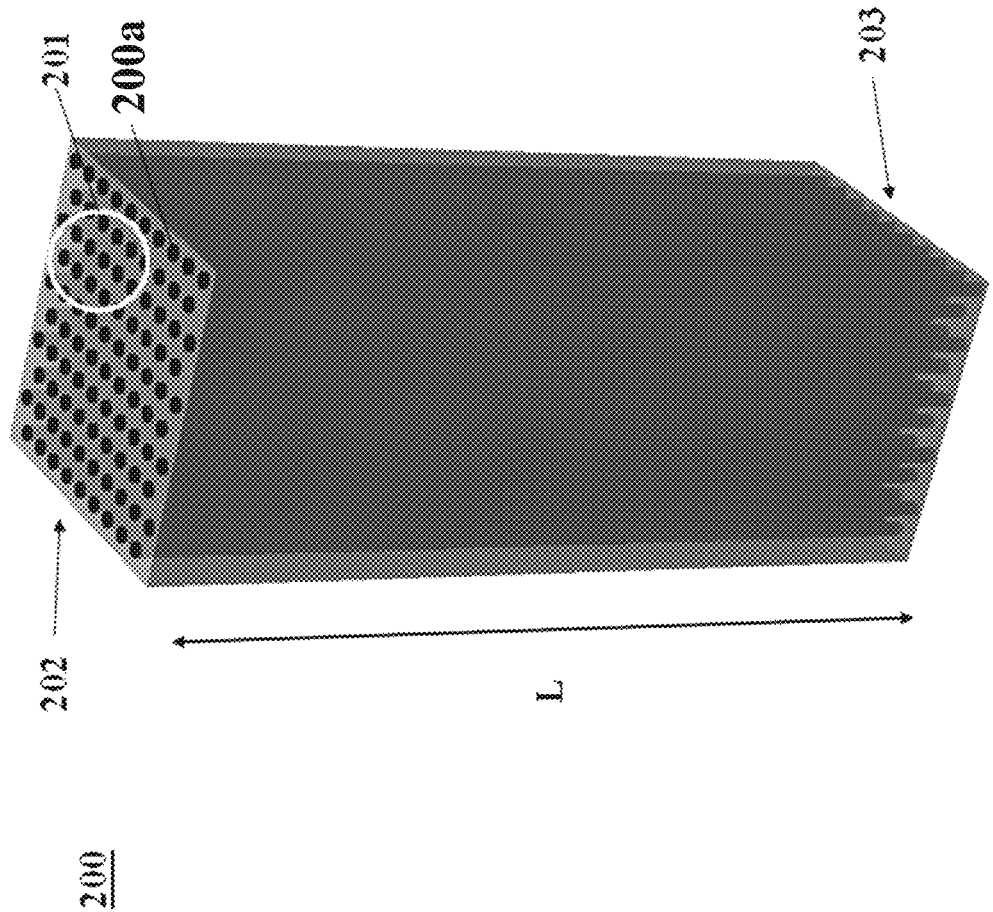
FIG. 2 is a schematic perspective view of a thermoelectric element, in accordance with an embodiment of the present disclosure.
Figure 3:
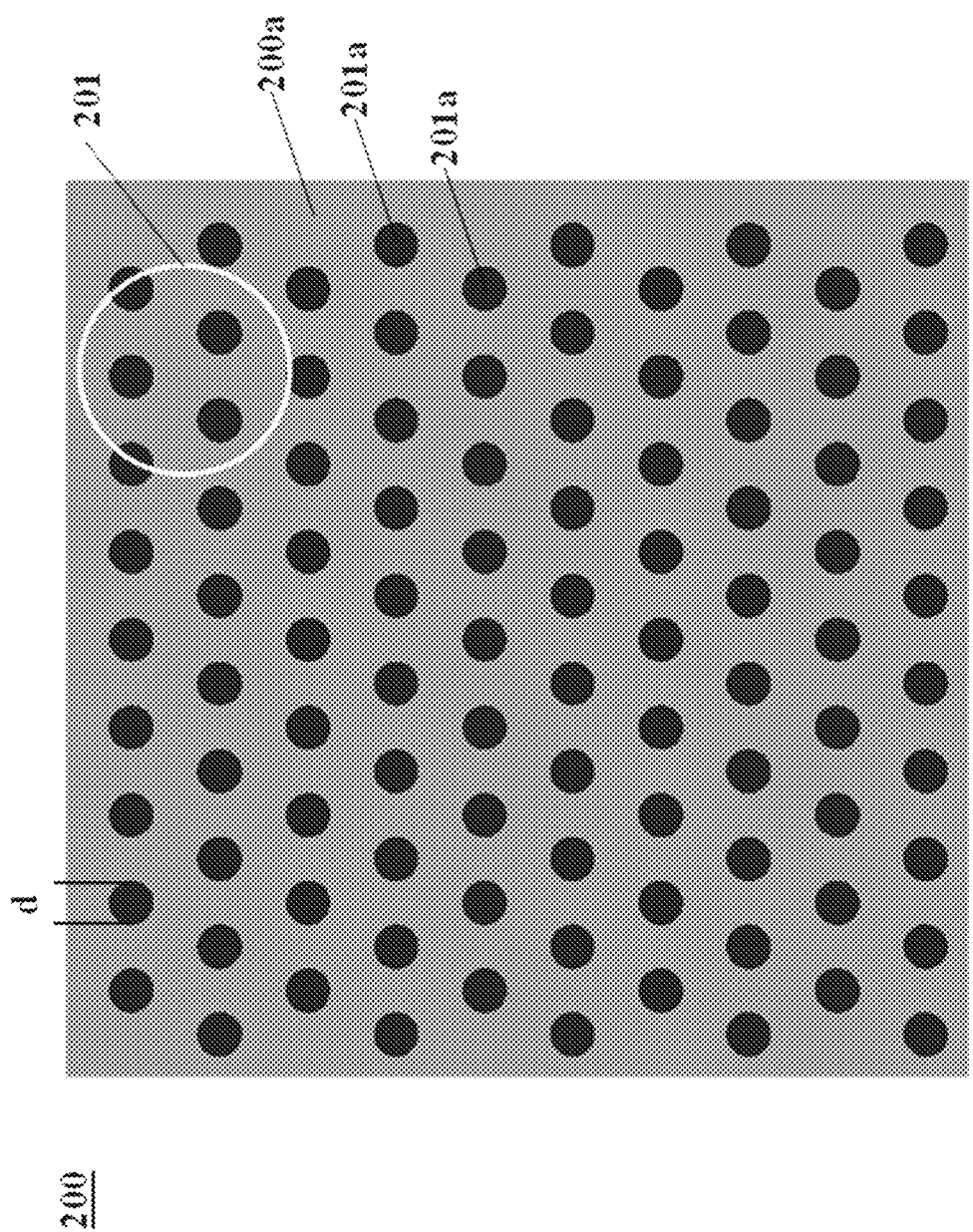
FIG. 3 is a schematic top view of the thermoelectric element of FIG. 2, in accordance with an embodiment of the present disclosure.
Figure 4:
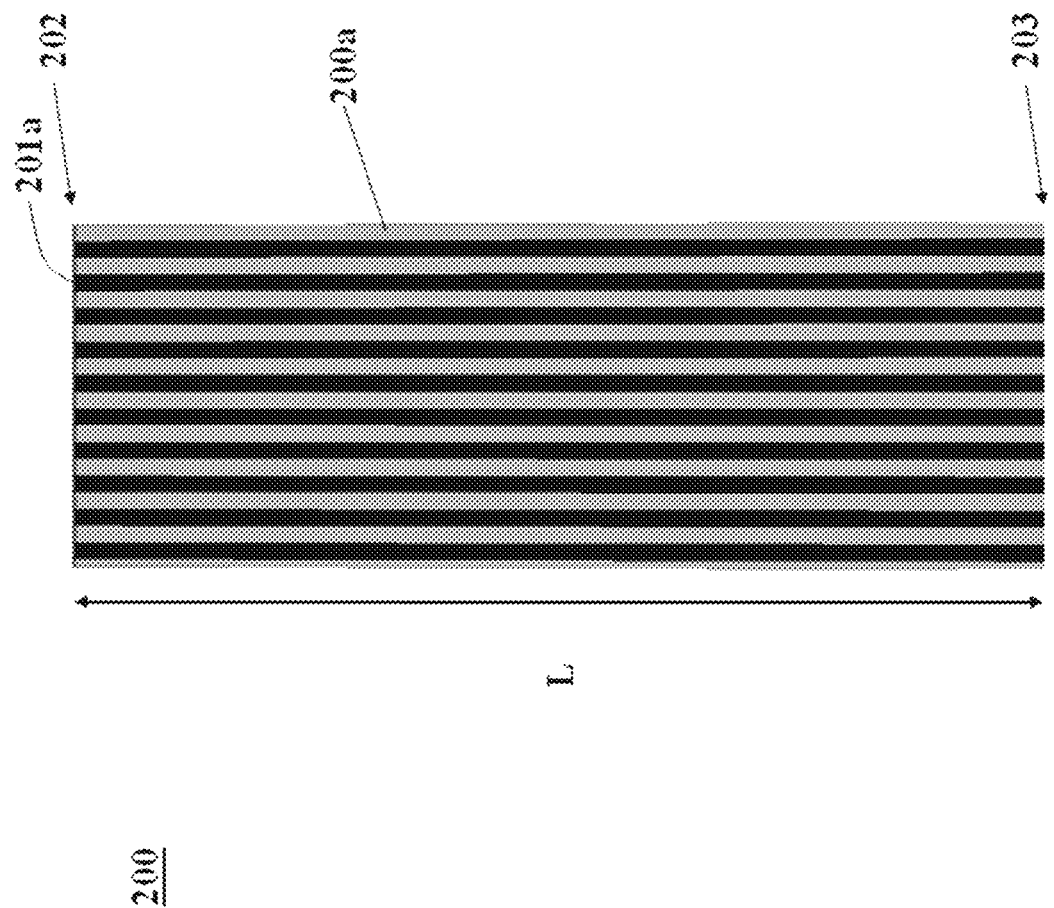
FIG. 4 is a schematic side view of the thermoelectric element of FIGS. 2 and 3, in accordance with an embodiment of the present disclosure.

FIG. 2 is a schematic perspective view of a thermoelectric element 200 having an array of holes 201 (select holes circled), in accordance with an embodiment of the present disclosure. The array of holes can be referred to as a "nanomesh" herein. FIGS. 3 and 4 are perspective top and side views of the thermoelectric element 200. The element 200 can be an n-type or p-type element, as described elsewhere herein. The array of holes 201 includes individual holes 201a that can have widths from several nanometers or less up to microns, millimeters or more. In some embodiments, the holes have widths (or diameters, if circular) ("d") between about 1 nm and 500 nm, or 5 nm and 100 nm, or 10 nm and 30 nm. The holes can have lengths ("L") from about several nanometers or less up to microns, millimeters or more. In some embodiments, the holes have lengths between about 0.5 microns and 1 centimeter, or 1 micron and 500 millimeters, or 10 microns and 1 millimeter.

The holes 201a are formed in a substrate 200a. In some cases, the substrate 200a is a solid state material, such as e.g., carbon, silicon, germanium, gallium arsenide, aluminum gallium arsenide, silicide alloys, alloys of silicon germanium, bismuth telluride, lead telluride, oxides (e.g., $SiO_x$, where 'x' is a number greater than zero), gallium nitride and tellurium silver germanium antimony (TAGS) containing alloys. The substrate 200a may be formed of a semiconductor material comprising one or more semiconductors. The semiconductor material can be doped n-type or p-type for n-type or p-type elements, respectively.

In some cases, the holes 201a are filled with a gas, such as He, Ne, Ar, $N_2$, $H_2$, $CO_2$, $O_2$, or a combination thereof. In other cases, the holes 201a are under vacuum. Alternatively, the holes may be filled (e.g., partially filled or completely filled) with a semiconductor material, an insulating (or dielectric) material, or a gas (e.g., He, Ar, $H_2$, $N_2$).

A first end 202 and second end 203 of the element 200 can be in contact with a substrate having a semiconductor-containing material, such as silicon or a silicide. The substrate can aid in providing an electrical contact to an electrode on each end 202 and 203. Alternatively, the substrate can be precluded, and the first end 202 and second end 203 can be in contact with a first electrode (not shown) and a second electrode (not shown), respectively.

In some embodiments, the holes 201a are substantially monodisperse. Monodisperse holes may have substantially the same size, shape and/or distribution (e.g., cross-sectional distribution). In other embodiments, the holes 201a are distributed in domains of holes of various sizes, such that the holes 201a are not necessarily monodisperse. For example, the holes 201a may be polydisperse. In some situations, the device 200 includes a first set of holes with a first diameter and a second set of holes with a second diameter. The first diameter is larger than the second diameter. In other cases, the device 200 includes two or more sets of holes with different diameters.

The holes 201a can have various packing arrangements. In some cases, the holes 201a, when viewed from the top (see FIG. 3), have a hexagonal close-packing arrangement.

In some embodiments, the holes 201a in the array of holes 201 have a center-to-center spacing between about 1 nm and 500 nm, or 5 nm and 100 nm, or 10 nm and 30 nm. In some cases, the center-to-center spacing is the same, which may be the case for monodisperse holes 201a. In other cases, the center-to-center spacing can be different for groups of holes with various diameters and/or arrangements.

The dimensions (lengths, widths) and packing arrangement of the holes 201, and the material and doping configuration (e.g., doping concentration) of the element 200 can be selected to effect a predetermined electrical conductivity and thermal conductivity of the element 200, and a thermoelectric device having the element 200. For instance, the diameters and packing configuration of the holes 201 can be selected to minimize the thermal conductivity, and the doping concentration can be selected to maximize the electrical conductivity of the element 200.

The array of holes 201 can have an aspect ratio (e.g., the length of the element 200 divided by width of an individual hole 201a) of at least about 1.5:1, or 2:1, or 5:1, or 10:1, or 20:1, or 50:1, or 100:1, or 1,000:1, or 5,000:1, or 10,000:1, or 100,000:1, or 1,000,000:1, or 10,000,000:1, or 100,000,000:1, or more.

In some embodiments, thermoelectric elements can include an array of wires. The array of wires can include individual wires that are, for example, rod-like structures.

Figure 5:
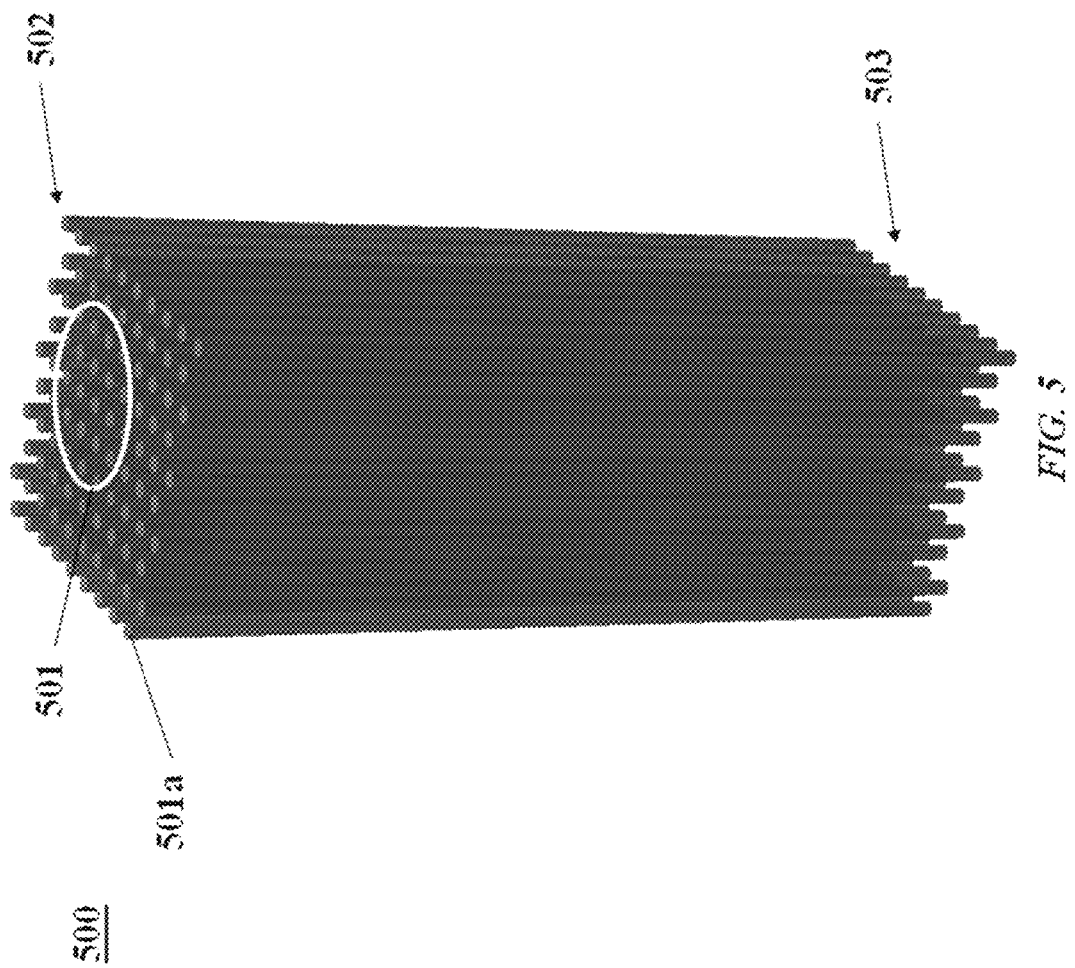
FIG. 5 is a schematic perspective top view of a thermoelectric element, in accordance with an embodiment of the present disclosure.
Figure 6:
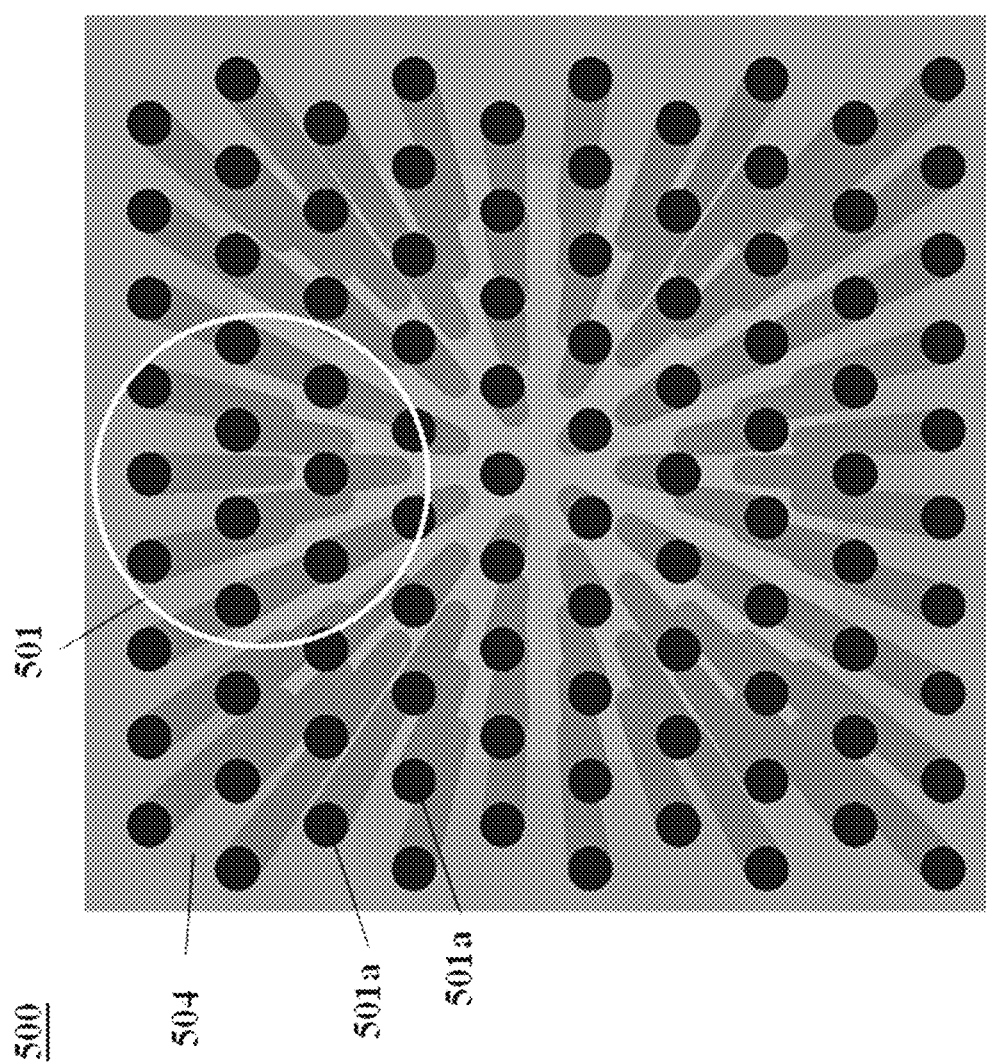
FIG. 6 is a schematic perspective top view of the thermoelectric element of FIG. 5, in accordance with an embodiment of the present disclosure.

FIG. 5 is a schematic perspective top view of a thermoelectric element 500, in accordance with an embodiment of the present disclosure. FIG. 6 is a schematic perspective top view of the thermoelectric element 500. The thermoelectric element 500 may be used with devices, systems and methods provided herein. The element 500 includes an array of wires 501 having individual wires 501a. In some embodiments, the wires have widths (or diameters, if circular) ("d") between about 1 nm and 500 nm, or 5 nm and 100 nm, or 10 nm and 30 nm. The wires can have lengths ("L") from about several nanometers or less up to microns, millimeters or more. In some embodiments, the wires have lengths between about 0.5 microns and 1 centimeter, or 1 micron and 500 millimeters, or 10 microns and 1 millimeter.

In some embodiments, the wires 501a are substantially monodisperse. Monodisperse wires may have substantially the same size, shape and/or distribution (e.g., cross-sectional distribution). In other embodiments, the wires 501a are distributed in domains of wires of various sizes, such that the wires 501a are not necessarily monodisperse. For example, the wires 501a may be polydisperse.

In some embodiments, the wires 501a in the array of wires 501 have a center-to-center spacing between about 1 nm and 500 nm, or 5 nm and 100 nm, or 10 nm and 30 nm. In some cases, the center-to-center spacing is the same, which may be the case for monodisperse wires 501. In other cases, the center-to-center spacing can be different for groups of wires with various diameters and/or arrangements.

In some embodiments, the wires 501a are formed of a semiconductor material, such as, e.g., silicon, germanium, gallium arsenide, aluminum gallium arsenide, silicide alloys, alloys of silicon germanium, bismuth telluride, lead telluride, oxides (e.g., $SiO_x$, where 'x' is a number greater than zero), gallium nitride and tellurium silver germanium antimony (TAGS) containing alloys. The wires 501a can be doped with an n-type dopant or a p-type dopant.

In some embodiments, the wires 501a are attached to semiconductor substrates at a first end 502 and second end 503 of the element 500. The semiconductor substrates can have the n-type or p-type doping configuration of the individual wires 501a. In other embodiments, the wires 501a at the first end 502 and second end 503 are not attached to semiconductor substrates, but can be attached to electrodes. For instance, a first electrode (not shown) can be in electrical contact with the first end 502 and a second electrode can be electrical contact with the second end 503.

With reference to FIG. 6, space 504 between the wires 501a may be filled with a vacuum or various materials. In some embodiments, the wires are laterally separated from one another by an electrically insulating material, such as a silicon dioxide, germanium dioxide, gallium arsenic oxide, spin on glass, and other insulators deposited using, for example, chemical vapor deposition or atomic layer deposition. In other embodiments, the wires are laterally separated from one another by vacuum or a gas, such as He, Ne, Ar, $N_2$, $H_2$, $CO_2$, $O_2$, or a combination thereof.

The array of wires 501 can have an aspect ratio—length of the element 500 divided by width of an individual wire 501a—of at least about 1.5:1, or 2:1, or 5:1, or 10:1, or 20:1, or 50:1, or 100:1, or 1,000:1, or 5,000:1, or 10,000:1, or 100,000:1, or 1,000,000:1, or 10,000,000:1, or 100,000,000:1, or more. In some cases, the length of the element 500 and the length of an individual wire 501a are substantially the same.

Thermoelectric elements provided herein can be incorporated in thermoelectric devices for use in cooling and/or heating and, in some cases, power generation. In some examples, the device 100 may be used as a power generation device. In an example, the device 100 is used for power generation by providing a temperature gradient across the electrodes and the thermoelectric elements of the device 100.

Figure 7:
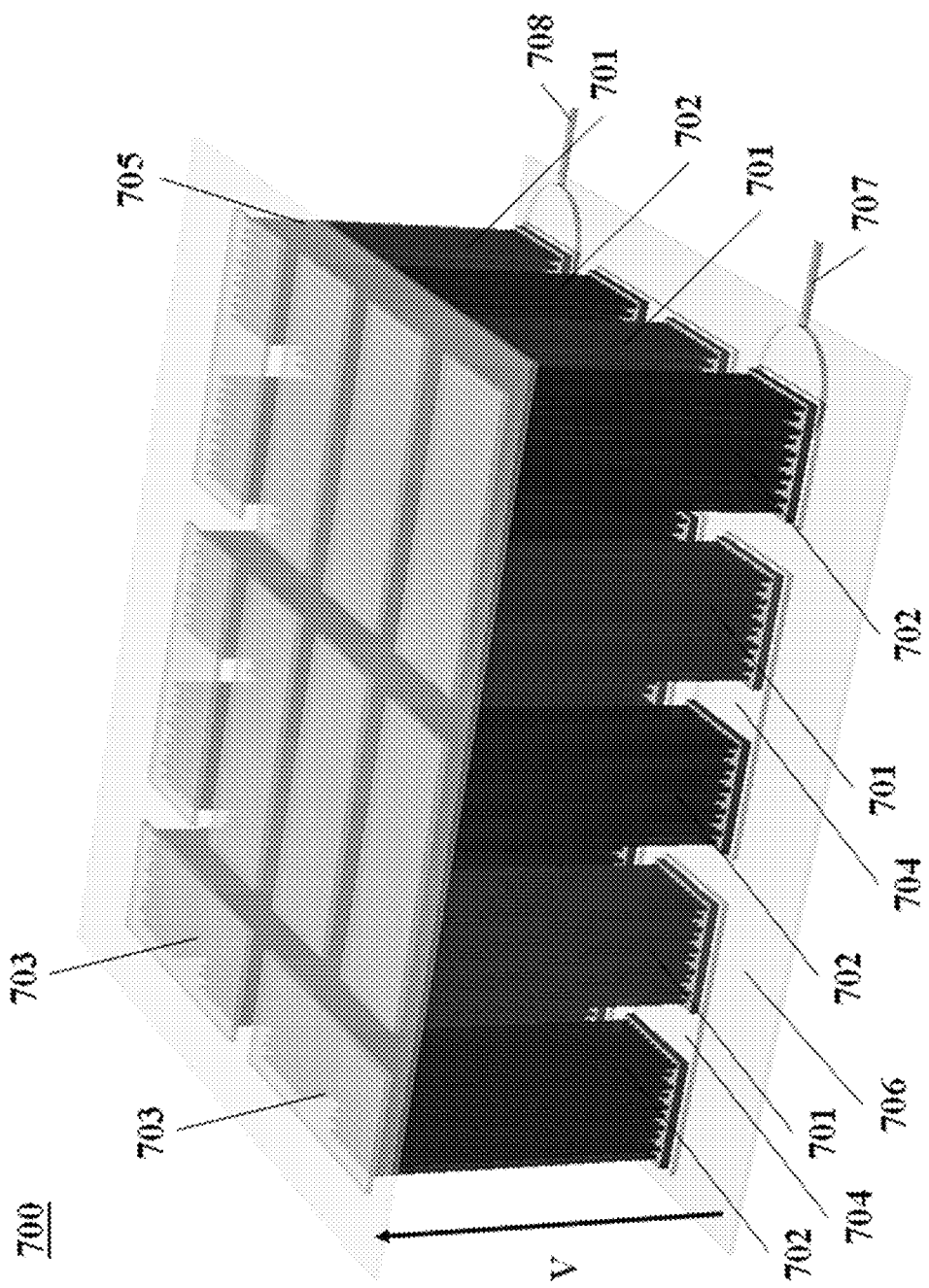
FIG. 7 is a schematic perspective view of a thermoelectric device comprising elements having an array of wires, in accordance with an embodiment of the present disclosure.

FIG. 7 shows a thermoelectric device 700 having n-type elements 701 and p-type elements 702, in accordance with an embodiment of the present disclosure. The n-type elements 701 and p-type elements 702 each include an array of wires, such as nanowires. An array of wires can include a plurality of wires. The n-type elements 701 include n-type (or n-doped) wires and the p-type elements 702 include p-type wires. The wires can be nanowires or other rod-like structures.

Adjacent n-type elements 701 and p-type elements 702 are electrically connected to one another at their ends using electrodes 703 and 704. The device 700 includes a first thermally conductive, electrically insulating layer 705 and a second thermally conductive, electrically insulating layer 706 at opposite ends of the elements 701 and 702.

The device 700 includes terminals 707 and 708 that are in electrical communication with the electrodes 703 and 704. The application of an electrical potential across the terminals 707 and 708 generates a flow of electrons and holes in the n-type and p-type elements 701 and 702, respectively, which generates a temperature gradient across the elements 701 and 702. The first thermally conductive, electrically insulating layer 705 is a cold side of the device 700; the second thermally conductive, electrically insulating layer 706 is a hot side of the device 700. The cold side is cooler (i.e., has a lower operating temperature) than the hot side.

Figure 8:
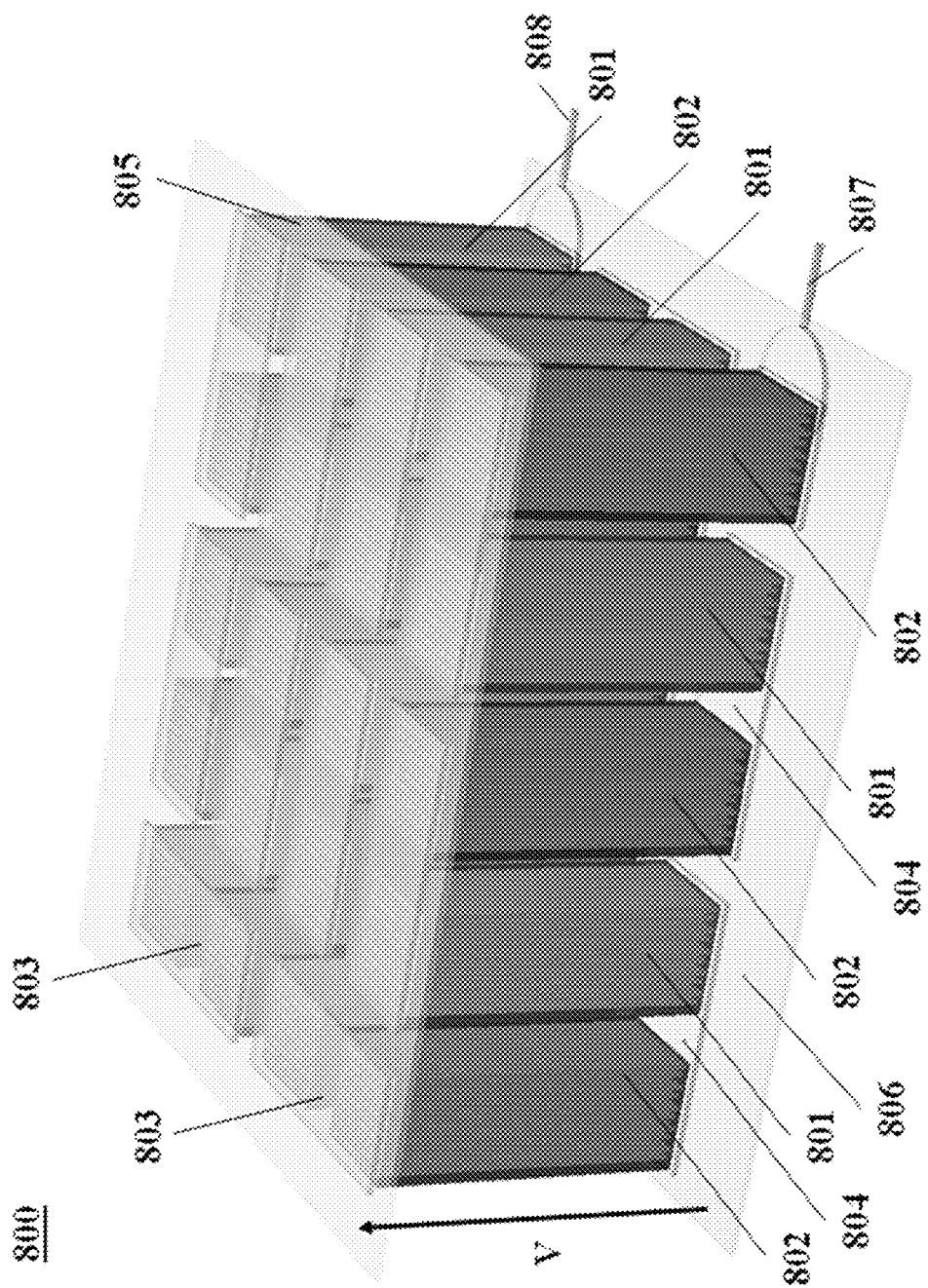
FIG. 8 is a schematic perspective view of a thermoelectric device comprising elements having an array of holes, in accordance with an embodiment of the present disclosure.

FIG. 8 shows a thermoelectric device 800 having n-type elements 801 and p-type elements 802, in accordance with an embodiment of the present disclosure. The n-type elements 801 and p-type elements 802 are formed in n-type and p-type semiconductor substrates, respectively. Each substrate can include an array of holes, such as nanoholes. The array of holes each includes a plurality of holes. An individual hole can span the length of an n-type or p-type element. The holes can be monodisperse, in which case hole dimensions and center-to-center spacing may be substantially constant. In some cases, the array of holes includes holes with center-to-center spacing and hole dimensions (e.g., widths or diameters) that may be different. In such a case, the holes may not be monodisperse.

Select n-type elements 801 and p-type elements 802 are electrically connected to one another at their ends by electrodes 803 and 804. The device 800 includes a first thermally conductive, electrically insulating layer ("first layer") 805 and a second thermally conductive, electrically insulating layer ("second layer") 806 at opposite ends of the elements 801 and 802.

The device 800 includes terminals 807 and 808 that are in electrical communication with the electrodes 803 and 804. The application of an electrical potential across the terminals 807 and 808 generates the flow of electrons and holes in the n-type and p-type elements 801 and 802, respectively, which generates a temperature gradient across the elements 801 and 802. The first thermally conductive, electrically insulating layer 805 is a cold side of the device 800; the second thermally conductive, electrically insulating layer 806 is a hot side of the device 800. The cold side is cooler (i.e., has a lower operating temperature) than the hot side.

The thermoelectric device 800 has a temperature gradient from the second thermally conductive, electrically insulating layer 806 to the first thermally conductive, electrically insulating layer 805. In some cases, the holes are disposed parallel to a vector oriented from the first layer 805 to the second layer 806. In other cases, the holes are disposed at an angle greater than 0° in relation to the vector. For instance, the holes can be disposed at an angle of at least about 1°, 10°, 20°, 30°, 40°, 50°, 60°, 70°, 80°, or 90° in relation to the vector.

Figure 9:
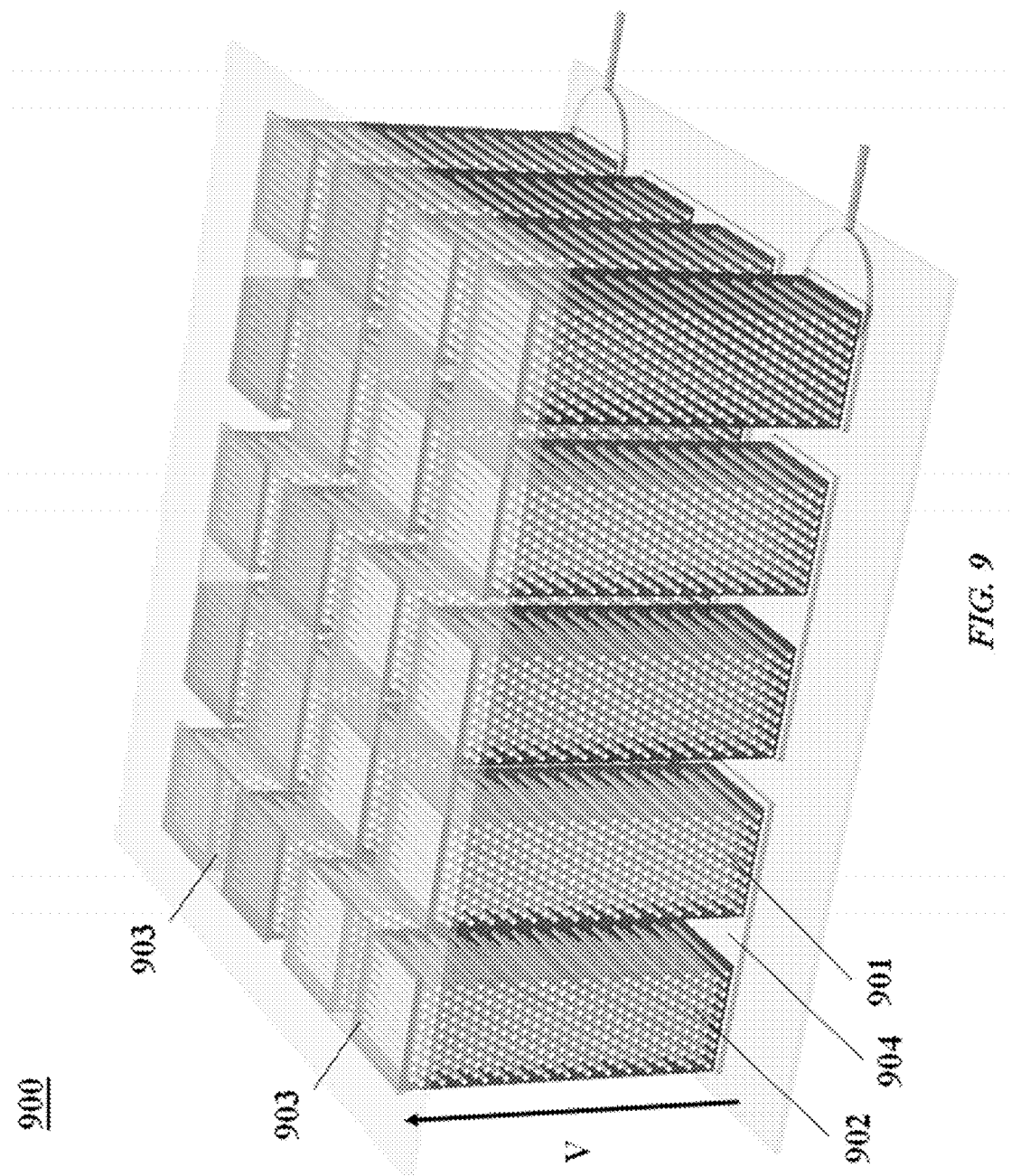
FIG. 9 is a schematic perspective view of a thermoelectric device comprising elements having an array of holes that are oriented perpendicularly with respect to the vector V, in accordance with an embodiment of the present disclosure.

FIG. 9 shows a thermoelectric device 900 having n-type elements 901 and p-type elements 902, with the elements having holes formed in substrates of the n-type and p-type elements. The holes are oriented perpendicular to a vector ("V") orthogonal to the electrodes 903 and 904 of the device 900.

Wires or holes of thermoelectric elements provided herein may be formed in a substrate and oriented substantially anti-parallel to a support structure, such as an electrode. In some examples, the wires or holes are oriented at an angle greater than 0°, or 10°, or 20°, or 30°, or 40°, or 50°, or 60°, or 70°, or 80°, or 85° in relation to the support structure. In an example, the wires or holes are oriented at an angle of about 90° in relation to the support structure. The electrode may be an electrode of a thermoelectric device. In some cases, wires or holes may be oriented substantially parallel to the electrode.

Methods for Forming Thermoelectric Devices

Another aspect of the present disclosure provides methods for forming holes in or wires from a substrate. In some cases, the methods comprise defining, with the aid of a metallic material, a pattern to be transferred to a substrate, and catalytically etching the substrate to define the pattern in the substrate.

In some embodiments, a method for forming a thermoelectric device having a plurality of holes or wires comprises forming a mask (or template) adjacent to a substrate, the mask comprising a polymer matrix having three-dimensional structures distributed or otherwise provided therein. In some examples, the three-dimensional structures are phase-separated in the polymer matrix. In some examples, three-dimensional structures phase-separated in the polymer matrix are immiscible in the polymer matrix. In such cases, the three-dimensional structures may agglomerate (or coalesce) in the polymer matrix. The three-dimensional structures may be formed of a polymeric material that is different from the material comprising the polymer matrix. In some cases, the three-dimensional structures are formed of a block copolymer. The three-dimensional structures may each be formed of a block copolymer. An individual three-dimensional structure, in some examples, includes three-dimensional rods or cylinders. The rods or cylinders can extend through the mask.

Next, the three-dimensional structures are removed to provide a plurality of holes exposing portions of the substrate. Exposed portions of the substrate can directly expose the substrate to a reaction space, or expose one or more intervening layers between the substrate and the reaction space, such as, for example, an oxide of the material comprising the substrate (e.g., native oxide). In some cases, the three-dimensional structures are removed by selectively etching the three-dimensional structures in relation to the polymer matrix. The plurality of holes defined a pattern. Next, an etching layer is deposited adjacent to the mask and exposed portions of the substrate. The etching layer comprises an etching material that facilitates etching of the substrate. The etching layer can be deposited using any vapor phase deposition technique, such as, for example, physical vapor deposition (e.g., sputtering). The mask is then removed to leave the etching layer. The etching layer may include particles (e.g., metallic particles) of the etching material adjacent to the substrate. The particles may be distributed in accordance with the pattern. The etching layer is then exposed to an oxidizing agent and a chemical etchant (also "etchant" herein) to form holes in the substrate. The holes may have shapes, sizes and distributions as described elsewhere herein. The holes, in some cases, have dimensions on the order of nanometers to micrometers. In some cases, the holes are nanoholes or nanoinclusions. The holes may define a nanomesh.

As an alternative, the pattern may be inverted to form wires in the substrate. In some examples, prior to depositing the etching layer, an etch block layer is deposited on portions of the substrate exposed through the holes in the mask. The etch block layer includes an etch block material that does not appreciably etch the substrate or, in some cases, etches the substrate at an etch rate that is lower, or substantially reduced, in relation to the rate at which the etching material etches the substrate. In some examples, the etch block layer prevents the etching of the substrate. Next, the polymer matrix is removed to expose portions of the substrate. The exposed portions of the substrate may have one or more intervening layers thereon, such as, for example, a layer of an oxide (e.g., oxide of the substrate). The etching layer is then deposited on exposed portions of the substrate. The etching layer may also be deposited on the etch block layer. Portions of the etching layer may be at least partially aligned with the etch block layer (or vice versa). In some examples, the etch block layer may then be removed along with the overlying etching layer, such as with the aid of an etching chemistry that is selective to the etch block layer. Next, the etching layer is exposed to an oxidizing agent and an etchant to form wires from the substrate. The etching material can serve as a catalyst to form the wires. The wires may be cylindrical. In some case, the wires have widths (or diameters) on the order of nanometers to micrometers. The wires may be nanowires.

The etching layer can include a metallic material having one or more elemental metals. For instance, the etching layer can include a metallic material having one or more metals selected from gold, silver, platinum, palladium, and other noble metals. In some examples, the etching material can be selected from gold, silver, platinum, palladium, and other noble metals. As discussed elsewhere herein, in certain embodiments, the etching layer can include a metallic material that may comprise any combination or alloy of gold, silver, platinum, chromium, molybdenum, tungsten, palladium, and/or other noble metals.

Figure 14:
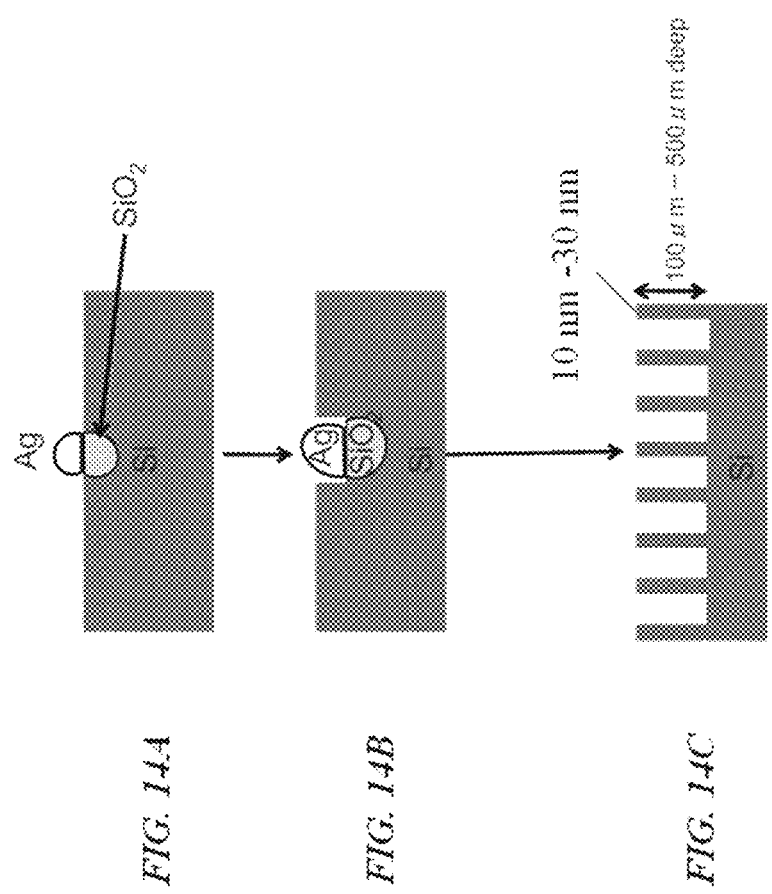
FIGS. 14A-14C schematically illustrates a process for catalytically forming an array of holes, in accordance with an embodiment of the present disclosure.

In some embodiments, the etching material facilitates the etching of the semiconductor substrate. For instance, the etching material can catalytically facilitate the etching of the semiconductor substrate (see, e.g., FIGS. 14 and 15). Etching of the semiconductor substrate can be anisotropic, having an etch rate along an axis orthogonal to a surface of the substrate that is greater than an etch rate along an axis parallel to the surface of the substrate. In some examples, the etching material may catalyze the oxidation of a semiconductor substrate to an oxide of the semiconductor (e.g., $SiO_2$).

The etching layer may facilitate the etching of the substrate at a rate that is higher than the rate at which the etch block layer etches the substrate (e.g., semiconductor substrate). In some cases, there is substantially little or no appreciable etching of portions of the substrate that are adjacent to etch block material upon, for example, exposure of the etch block material to an oxidizing agent and an etchant.

In some embodiments, etch block material can be selected from elemental metals, metalloids, non-metals, polymers, and combinations thereof. Examples of elemental metals for use as etch block material layer include, without limitation, chromium, molybdenum, tungsten, titanium, niobium, and combinations thereof. Non-metals may for use as etch block material include carbon, semiconductors (e.g., silicon, germanium, gallium arsenide), composite materials, derivatives thereof (e.g., oxides, nitrides), or combinations thereof. Examples of non-metals include, without limitation, silicon dioxide, silicon nitride, silicon carbide, gallium oxide, gallium nitride, gallium arsenide, derivatives thereof (e.g., silicides) and combinations thereof. Examples of metalloids for use as etch block material include, without limitation, boron, silicon, germanium, arsenic, antimony, tellurium and combinations thereof. Examples of polymers for use as etch block material include, without limitation, polyimide, polycarbonate, polyethylene, polypropylene, and combinations thereof.

The etch block material of the etch block layer and the etching material of the etching layer can be selected such that, upon exposure of the etch block layer and the etching layer to an oxidizing agent and a chemical etchant, the etching layer facilitates the etching of the semiconductor substrate at a rate (substrate etch rate) that is higher in relation to the substrate etch rate of the etch block layer. In some examples, a ratio of etching rates of portions of the substrate adjacent to the etching layer in relation to portions of the substrate adjacent to the etch block layer is at least about 1:2:1, 1.3:1, 1.4:1, 1:5:1, 2:1, 3:1, 4:1, 5:1, 10:1, 100:1, 500:1, 1,000:1, 5,000:1, 10,000:1, 100,000:1, 1,000,000:1.

In some embodiments, a method for forming a thermoelectric device having a plurality of holes or wires comprises forming a mask (or template) adjacent to a substrate, the mask having three-dimensional structures in a polymer matrix. The three-dimensional structures may be phase-separated in the polymer matrix. In some cases, the three-dimensional structures are formed of a block copolymer. The three-dimensional structures may each be formed of a block copolymer. Next, the polymer matrix is removed (e.g., by etching the polymer matrix in relation to the three-dimensional structures), thereby exposing portions of the substrate and providing a plurality of free-standing three-dimensional structures adjacent to the substrate. The matrix may be removed with the aid of an etching chemistry that is selective to the polymer matrix—e.g., a chemistry that provides an etch rate of the polymer matrix that is greater than the etch rate of the three-dimensional structures. The plurality of free-standing three-dimensional structures of the mask may define a pattern for transfer to the substrate. An etching layer is then deposited adjacent to the mask and exposed portions of the substrate. As described elsewhere herein, exposed portions of the substrate can directly expose the substrate to a reaction space, or expose one or more intervening layers between the substrate and the reaction space, such as, for example, an oxide of the material comprising the substrate (e.g., native oxide). The free-standing three-dimensional structures are then removed and the etching layer is exposed to an oxidizing agent and an etchant to form wires from the substrate. The material of the etching layer may serve as a catalyst to form the wires. The wires may be cylindrical. In some case, the wires have widths (or diameters) on the order of nanometers to micrometers. The wires may be nanowires.

As an alternative, the pattern may be inverted to form holes in the substrate. In some examples, prior to depositing the etching layer, an etch block layer is deposited adjacent to the substrate and the free-standing three-dimensional structures. The etch block layer is formed of an etch block material that etches the substrate at an etch rate that is lower or substantially reduced in relation to the rate at which the etching material of the etching layer etches the substrate. In some cases, the etch block layer prevents the etching of the substrate. Next, the free-standing three-dimensional structures are removed to expose portion of the substrate. The free-standing three-dimensional structures may be removed with the aid of chemical etching and/or mechanical etching, such as, for example, chemical mechanical polishing or planarization (CMP). The exposed portions of the substrate may have a layer of an oxide formed thereon, such as a native oxide. The etching layer is then deposited on exposed portions of the substrate. The etching layer may also be deposited on the etch block layer. Next, the etching layer is exposed to an oxidizing agent and an etchant to form holes in the substrate. The material of the etching layer may serve as a catalyst to form the holes. The holes may be cylindrical. In some case, the holes have widths (or diameters) on the order of nanometers to micrometers. The holes may be nanoholes.

In some situations, the template (or mask) is formed of a first polymeric material and the three-dimensional structures defining the pattern are formed of a second polymeric material. The second polymeric material is embedded in a matrix comprised of the first polymeric material.

The first polymeric material can be formed of a material having a molecular weight of at least about 1 kilodalton (kDa), or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or 200 kDa, or more. In some situations, the first polymeric material has a molecular weight between about 10 kDa and 80 kDa, or 20 kDa and 60 kDa, or 30 kDa and 50 kDa. In some embodiments, the first polymeric material is polystyrene.

The second polymeric material can be formed of a material having a molecular weight of at least about 1 kDa, or 2 kDa, or 3 kDa, or 4 kDa, or 5 kDa, or 6 kDa, or 7 kDa, or 8 kDa, or 9 kDa, or 10 kDa, or 20 kDa, or 30 kDa, or 40 kDa, or 50 kDa, or 100 kDa, or more. In some situations, the second polymeric material has a molecular weight between about 5 kDa and 40 kDa, or 10 kDa and 30 kDa, or 15 kDa and 25 kDa. In some embodiments, the second polymeric material is a block copolymer. In some cases, the second polymeric material can be selected from poly(methyl methacrylate) (PMMA), poly(styrene-b-dimethylsiloxane) (PS-b-PDMS), poly(styrene-b-ethylene oxide) (PS-b-PEO), poly(styrene-b-4-vinylpyridine) (PS-b-P4VP), poly(styrene-block-.2-vinylpyridine) (PS-b-P2VP), or mixtures thereof.

The second polymeric material can be removed with the aid of an etching chemistry that may be selected based on the material comprising the second polymeric material and, in some cases, the first polymeric material. For example, a second polymeric material formed of PS-b-PDMS can be etched using hydrogen fluoride. As another example, a second polymeric material formed of PS-b-PEO can be etched using hydrogen iodide. PMMA can be etched using acetic acid. Etching chemistries for various polymeric materials can be found at, for example, Silverstein, M. S., Cameron, N. R., & Hillmyer, M. A. (2011), *Porous Poly-*

*mers*, New Jersey: John Wiley & Sons, Inc. which is entirely incorporated herein by reference.

The template can be used to form a pattern of holes or rod-like structures. An array of holes can be formed in the substrate by providing a metallic material in the holes of the template to define an array of particles (e.g., nanoparticles) adjacent to the substrate. With the aid of the metallic material, the substrate can be etched to form a thermoelectric element having an array of holes. Alternatively, an array of rod-like structure can be formed from the substrate by etching, with the aid of a metallic material, the substrate relative to metallic particles adjacent to the substrate to form a thermoelectric element having an array of rods (or wires).

In some embodiments, thermoelectric elements are formed by providing a template adjacent to a substrate, such as a semiconductor (e.g., silicon) substrate. The template can be formed of a polymeric material, such as a copolymer (e.g., block copolymer). In an example, a template is formed by providing a block copolymer and forming an array of cylinders in the block copolymer to define the template.

In some situations, a template (or mask) is formed by providing a polymeric mixture having a first polymeric material and a second polymeric material, and spin coating the polymeric mixture over a semiconductor substrate. Upon spin coating and thermal annealing, the second polymeric mixture phase separates into domains of three-dimensional structures (e.g., cylindrical structures) that define a pattern in the template. Such phase separation can include the three-dimensional structures agglomerating into domains. The three-dimensional structures are disposed in a polymeric matrix having the first polymeric material. Next, to form an array of holes (see, e.g., FIG. 2) in the substrate, the three-dimensional structures can be etched to reveal the substrate, and the array of holes can be catalytically transferred to the substrate to provide an array of holes (or inclusions) in the substrate.

Alternatively, to form an array of wires (or rods) from the substrate (see, e.g., FIG. 5), the polymeric matrix can be etched to provide an array of three-dimensional structures over the substrate. A pattern defined by the array of three-dimensional structures can then be catalytically transferred to the substrate to provide an array of wires formed from the substrate.

Figure 16:
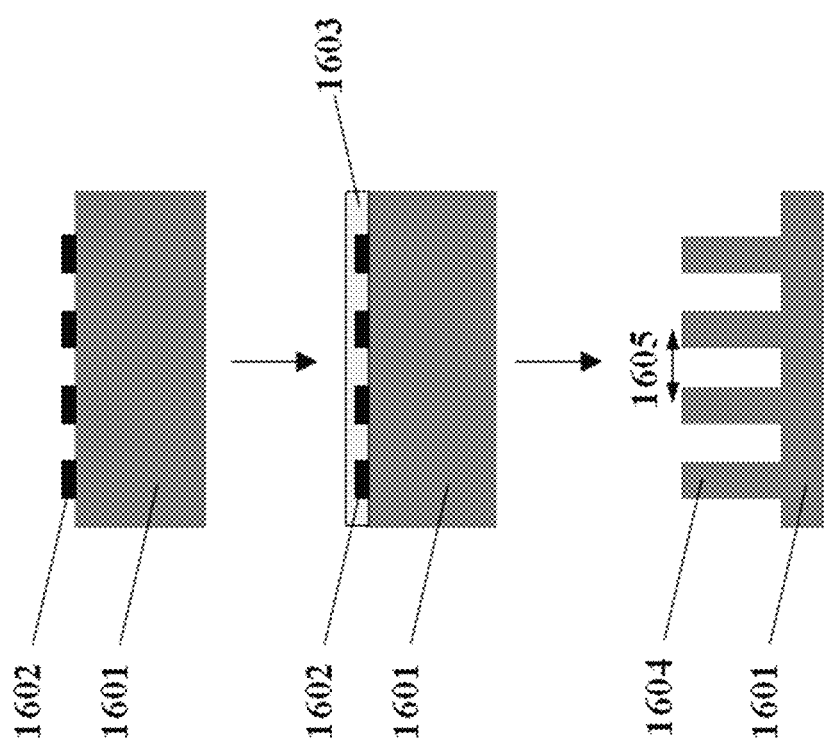
FIG. 16 schematically illustrates a process for forming a pattern of wires, in accordance with an embodiment of the present disclosure.

As another alternative, to form an array of wires (or rods) from the substrate (see, e.g., FIG. 5), the three-dimensional structures can be etched to reveal the substrate (see, e.g., FIG. 16). A first layer of an etch block material is deposited on the polymeric matrix, including the holes formed in the polymeric matrix. The polymeric matrix is then removed, leaving an array of particles from the first layer adjacent to the semiconductor substrate. The array of particles defines a pattern. A second layer of an etching material is then deposited on the semiconductor substrate. The etch block material serves as a mask to limit or prevent etching of the semiconductor substrate that is facilitated by the etching material. A pattern defined by the array of particles is then catalytically transferred to the substrate to provide an array of wires formed from the semiconductor substrate.

Figure 10:
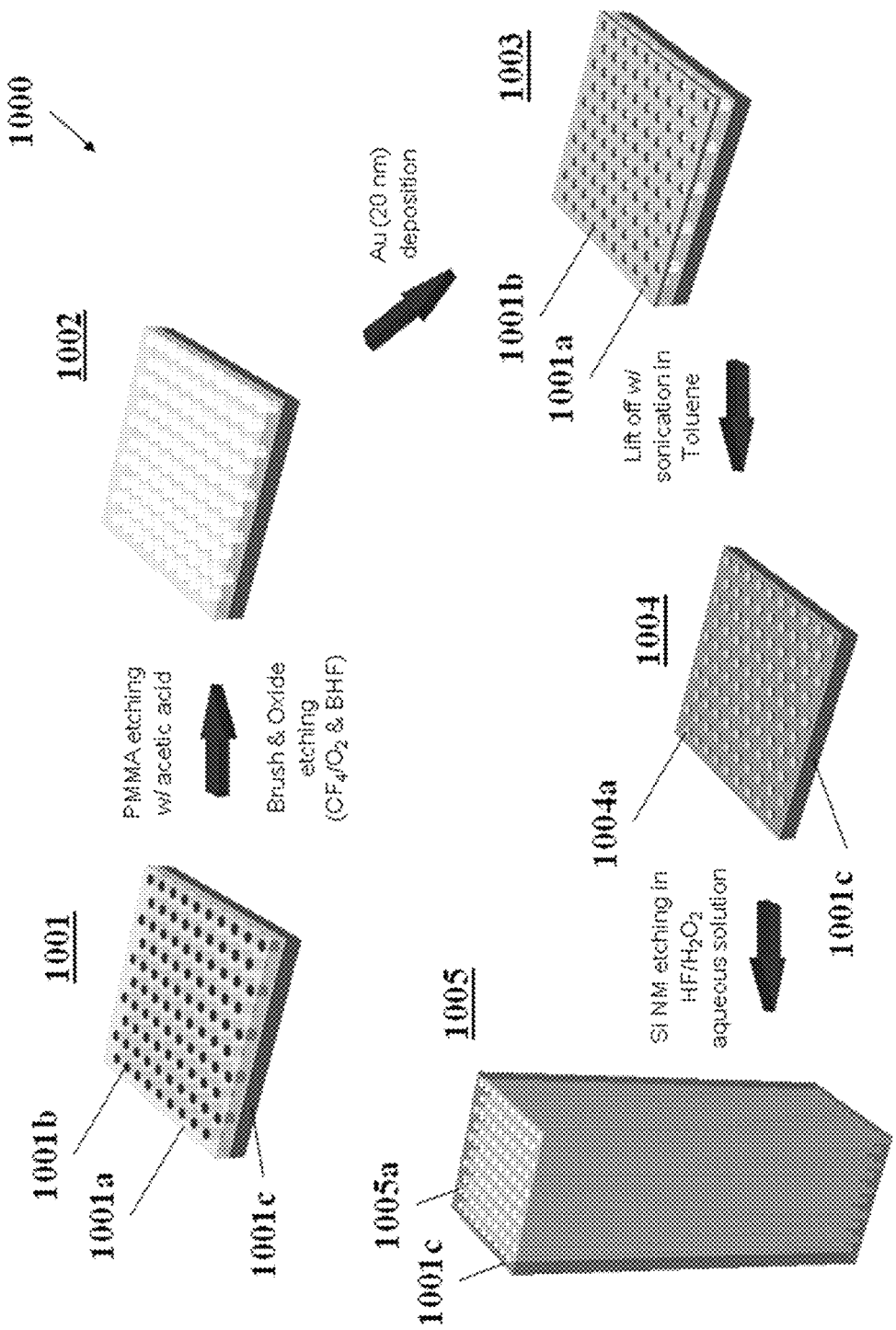
FIG. 10 shows a process for forming a thermoelectric device, in accordance with an embodiment of the present disclosure.

FIG. 10 shows a process 1000 for forming a thermoelectric device, in accordance with an embodiment of the present disclosure. In a first operation 1001, a mask (or template) 1001a having three-dimensional structures 1001b is provided over a substrate 1001c. The substrate 1001c can be a semiconductor substrate, such as a silicon substrate (e.g., n-type or p-type silicon). The three-dimensional structures 1001b can be cylinders (or rods). Alternatively, the three-dimensional structures 1001b can have other shapes, such as, e.g., triangular, square, or rectangular. The three-dimensional structures 1001b can have various sizes and distributions. In some situations, the three-dimensional structures 1001b have widths (or diameters) between about 1 nanometers ("nm") and 500 nm, or 5 nm and 100 nm, or 10 nm and 30 nm. The three-dimensional dimensional structures 1001b can have a center-to-center spacing between about 1 nm and 500 nm, or 5 nm and 100 nm, or 10 nm and 30 nm. In some embodiments, the three-dimensional structures 1001b are distributed in an array of three-dimensional structures. In some examples, the three-dimensional structures 1001b in the array are monodisperse.

In some situations, the three-dimensional structures 1001b are in a close packing arrangement, such as a hexagonally close packing arrangement. In other situations, the three-dimensional structures 1001b are in a random arrangement. In some cases, the three-dimensional structures 1001b are arranged in groups. Each group can have a predetermined distribution of the three-dimensional structures. The three-dimensional structures 1001b can be asymmetric, having lengths longer than their widths (or diameters).

The mask 1001a can be formed of a first polymeric material, such as polystyrene, and the three-dimensional structures 1001b can be formed of a second polymeric material, such as PMMA. The mask 1001a is formed by providing a mixture comprising the first and second polymeric materials, and coating the mixture onto the substrate 1001c using, for example, a spin coater or other systems and devices that may be used in semiconductor fabrication, such as, for example, dip coater, ink jet printing, spray coating, drop coasting, layer by layer coating using the Langmuir-Blodgett trough. In some cases, a spin coater is used to coat the mixture onto the substrate 1001c. A spin coater can be operated at between about 100 revolutions per minute (RPM) and 10,000 RPM, or 1000 and 4000 RPM, or 2000 and 3000 RPM, for a time period of at least about 1 second, 2 seconds, 3 seconds, 4 seconds, 5 seconds, 10 seconds, 15 seconds, 20 seconds, 25 seconds, 30 seconds, 35 seconds, 40 seconds, 45 seconds, 50 seconds, 55 seconds, 1 minute, 5 minutes, 10 minutes, 30 minutes, 1 hour, 12 hours, 24 hours, or more.

In some embodiments, the second polymeric material phase separates in a matrix of the first polymeric material to form the three-dimensional structures. The mask 1001a can be formed of a block copolymer having the first polymeric material and second polymeric material.

In some embodiments, after the mixture is applied (e.g., spin-coated) to the substrate 1001c, the substrate can be annealed at a temperature between about 100° C. and 300° C., or 150° C. and 250° C., or 180° C. and 210° C. for a period of at least about 1 second, or 10 seconds, or 30 seconds, or 1 minute, or 10 minutes, or 20 minutes, or 30 minutes, or 1 hour, or 2 hours, or 3 hours, or 4 hours, or 5 hours, or 6 hours, or 12 hours, or 24 hours, or 48 hours. The substrate can then be irradiated with ultraviolet light (e.g., 254 nm UV light) for a period of at least about 1 min, or 2 min, or 3 min, or 4 min, or 5 min, or 10 min, or 15 min, or 20 min, or 25 min, or 30 min.

Next, in a second operation 1002, the second polymeric material (including the three-dimensional structures 1001b) is etched relative to the first polymeric material. The second polymeric material can be etched with the aid of an acid, such as, e.g., nitric acid, acetic acid, hydrogen fluoride (HF), hydrogen chloride (HCl), hydrogen bromide (HBr), or hydrogen iodide (HI), or other etching chemistries, such as ozone or sodium hydroxide (NaOH). In an example, if the second polymeric material is formed of PMMA, the second polymeric material can be etched using acetic acid. Alternatively, gas phase etching can be performed, such as, for example, reactive ion etching using $O_2$, $CF_4$, $CHF_3$ or combinations thereof. Etching the polymeric material generates holes in the mask. The holes can expose a surface of the substrate 1001c adjacent to the mask 1001a. The exposed surface can include a layer of an oxide (native or thermally grown), such as a silicon oxide (e.g., silicon dioxide) if the substrate 1001c is formed of silicon. The oxide layer is removed by exposing the mask and the exposed portions of the substrate 1001c to an oxide etchant. In an example, the mask and exposed portions of the substrate 1001c are exposed to $CF_4/O_2$ and/or a buffered oxide etch (or a buffered hydrofluoric etch, "BHF").

BHF can be a mixture of a buffering agent, such as ammonium fluoride ($NH_4F$), and hydrofluoric acid (HF). In some cases, HCl is added to a BHF solution in order to dissolve insoluble products. In an example, a buffered oxide etch solution comprises a 6:1 volume ratio of about 40% $NH_4F$ in water to 49% HF in water. This solution can etch thermally grown oxide at a rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 100 nm/s, 1000 nm/s, or 10,000 nm/s at 25° C. Exposing the mask and the exposed portions of the substrate 1001c to an oxide etchant can remove the oxide layer from the exposed portions of the substrate 1001c.

In some embodiments, during the second operation 1002 the substrate can be rinsed with an acid (e.g., acetic acid, HF, HI) for a period of at least about 1 min, or 2 min, or 3 min, or 4 min, or 5 min, or 10 min, or 15 min, or 20 min, or 25 min, or 30 min, and water for a period of at least about 1 second, or 10 seconds, or 30 seconds, or 1 min, or 2 min, or 3 min, or 4 min, or 5 min to remove the second polymeric material (e.g., PMMA) and crosslinking a matrix having the first polymeric material.

Next, in a third operation 1003, a layer of a metallic material is deposited on the mask 1001a and the exposed portions of the substrate 1001c. In some embodiments, the layer of metallic material includes one or more elemental metals. For instance, the layer of metallic material can include one or more metals selected from gold, silver, platinum, chromium, molybdenum, tungsten, palladium, and other metals (e.g., noble metals), and any combinations thereof. The layer of the metallic material can be deposited with the aid of various deposition techniques, such as physical vapor deposition (e.g., sputtering, evaporative deposition), chemical vapor deposition (CVD), atomic layer deposition (ALD), or electroplating. In some embodiments, the layer of the metallic material, as formed, has a thickness between about 1 nm to about 500 nm, or 5 nm and 100 nm, or 10 nm and 30 nm. The layer of metallic material is formed on the mask and the exposed portions of the substrate 1001c.

Next, in a fourth operation 1004, the mask 1001a is removed to leave an array (or pattern) of metallic material 1004a on the substrate 1001c. In some embodiments, the array of metallic material is monodisperse. Next, in a fifth operation 1005, the metallic material 1004a and the substrate 1001c are exposed to an oxidizing agent (e.g., $O_3$, $NO_2$, $H_2O_2$) and an etchant (e.g., HF). In some embodiments, the metallic material 1004a facilitates a catalytic oxidation of the substrate 1001c at the metal-substrate interface, thereby forming an oxide between the metallic material 1004a and the substrate 1001c. An etchant then removes the oxide. Subsequent oxidation of the substrate and removal of an oxide formed between the metallic material and the substrate generates holes in the substrate. In some embodiments, the holes 1005a have lengths that are longer than the widths (or diameters) of the holes 1005a (i.e., the holes 1005a are anisotropic). The metallic material can then be removed with the aid of an etchant to leave holes in the substrate 1001c.

Alternatively, in the third operation 1003 a layer of a first metallic material can be deposited on the mask 1001a and exposed portions of the substrate 1001c. The first material can be an etch block material. In some cases, the layer of the first metallic material includes one or more metals selected from chromium, molybdenum and tungsten. In the fourth operation 1004 the mask 1001a can be removed to expose the substrate 1001c, as described above. Next, a layer of a second metallic material can be deposited on the layer of the first metallic material and the substrate 1001c. The second material can include an etching material. The layer of the second metallic material can then be exposed to an oxidizing agent (e.g., $O_3$, $NO_2$, $H_2O_2$) and an etchant (e.g., HF) to form cylinders in the substrate 1001c. The layer of the first and second metallic material on the cylinders can then be removed to leave cylinders (e.g., free-standing cylinders) formed from the substrate 1001c. In some situations, the bases of the cylinders are attached to the substrate 1001c.

FIGS. 14A-C schematically illustrate a process for catalytically etching a silicon substrate, in accordance with an embodiment of the present disclosure. The illustrated process can be applied to various semiconductor materials. In FIG. 14A, with a silver catalyst deposited on a silicon substrate, the silicon substrate and the catalyst are exposed to an oxidizing agent, such as hydrogen peroxide ($H_2O_2$), to form silicon dioxide, which is then contact with a chemical etchant, such as hydrofluoric acid (HF), to remove the silicon dioxide (FIG. 14B). Further exposure of the silicon substrate and the catalyst to the oxidizing agent and the chemical etchant forms an array of holes in the silicon substrate, as shown in FIG. 14C. In some situations, the silicon substrate and the catalyst are simultaneously contacted with the oxidizing agent and the chemical etchant, while in other situations the silicon substrate and the catalyst are alternately and sequentially contacted with the oxidizing agent and the chemical etchant.

The process of FIGS. 14A-14C may be used to form a pattern of holes or wires in a substrate, such as a semiconductor, insulating or metallic substrate.

Figure 15:
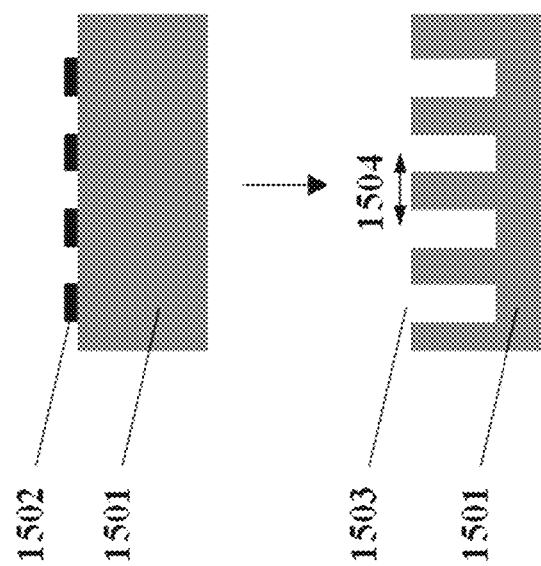
FIG. 15 schematically illustrates a process for forming a pattern of holes, in accordance with an embodiment of the present disclosure.

FIG. 15 schematically illustrates a process for catalytically transferring a pattern to a substrate 1501, in accordance with an embodiment of the present disclosure. The substrate 1501 may formed of one or more semiconductor materials. The pattern is characterized by the distribution of particles 1502 of a metallic material on the substrate 1501. The metallic material may include one or more of gold, silver, platinum, chromium, molybdenum, tungsten, palladium and other noble metals, and any combinations or alloys thereof. The particles 1502 may be formed as described elsewhere herein, such as, e.g., by forming a mask with a pattern of holes (e.g., nanoholes), depositing the metallic and removing the mask. The particles 1502 may be disposed directly on the substrate 1501, or, alternatively, on one or more intervening layers on the substrate 1501, such as an oxide layer. The metallic particles 1502 and the substrate 1501 are then exposed to a chemical etchant and an oxidizing agent to anisotropically etch the substrate 1501 to provide a pattern of holes 1503 in the substrate 1501. The particles 1502 may then be removed, such as with the aid of an etching chemistry that is selective to the metallic material. The holes

1503 may then be formed with a secondary material, such as a semiconductor or dielectric material, to form inclusions.

The pattern of holes 1503 may have a pitch (e.g., center-to-center spacing between adjacent holes) 1504 that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of the holes 1503 may have a roughness, as measured by transmission electron microscopy (TEM), between about 0.5 nm and 50 nm, or 1 nm and 20 nm, or 1 nm and 10 nm.

At least a fraction of the metallic material from the particles 1502 may be deposited on the exposed surfaces of the holes 1503. This may be the case if, for example, a residual amount of the metallic materials remain after removal of the particles 1502. In some cases, the fraction of metallic material adsorbed on the exposed surfaces of the holes 1503, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by x-ray photoelectron spectroscopy (XPS). In other cases, however, the fraction of metallic material adsorbed on the exposed surfaces of the holes 1503, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the holes 1503, taken against the number of surface atoms on the exposed surfaces, is between about 0.000001% and 25%, as measured by XPS.

FIG. 16 schematically illustrates a process for catalytically transferring a pattern to a substrate 1601, in accordance with an embodiment of the present disclosure. In a first step, a first layer 1602 of particles having an etch block material is formed on the substrate 1601, as described elsewhere herein, such as, e.g., by forming a mask with a pattern of holes, depositing the first layer 1602 and removing the mask. The first layer 1602 can include a plurality of particles. The material of the first layer 1602 can include one or more of chromium, molybdenum and tungsten. The particles of the first layer 1602 may be disposed directly on the substrate 1601, or, alternatively, on one or more intervening layers on the substrate 1601, such as an oxide layer (e.g., a native oxide layer). A second layer 1603 having a metallic material is then deposited on the first layer 1602, as described elsewhere herein. The material of the second layer 1603 may be different from the material of the first layer 1602. The metallic material of the second layer 1603 can include one or more of gold, silver, platinum, palladium and other noble metals. Next, the first layer 1602 and second layer 1603 are exposed to a chemical etchant and an oxidizing agent. With the first layer serving as a mask (or etch block layer), the metallic material of the second layer 1603 etches portions of the substrate 1601 that are in contact with the second layer 1603. Portions of the substrate 1601 that are in contact with the first layer 1602 may not be etched. This provides a pattern of wires (e.g., nanowires) 1604 in the substrate 1601. The material comprising the first layer 1602 and second layer 1603 may then be removed, such as with the aid of an etching chemistry that is selective to the metallic materials and not the material comprising the substrate 1601.

The pattern of wires 1604 may have a pitch 1605 that is less than or equal to about 5000 nanometers (nm), or 1000 nm, or 500 nm, or 400 nm, or 300 nm, or 200 nm, or 100 nm, or 50 nm, or 40 nm, or 30 nm, or 20 nm, or 15 nm, or 10 nm, or 5 nm, or less. Exposed surfaces of each of the wires 1604 may have a roughness, as measured by transmission electron microscopy (TEM), between about 0.5 nm and 50 nm, or 1 nm and 20 nm, or 1 nm and 10 nm.

At least a fraction of the metallic material from the first layer 1602 and/or the second layer 1603 may be deposited on the exposed surfaces of the wires 1604. This may be the case if, for example, a residual amount of one or both of the metallic materials remains on the exposed surfaces of the wires 1604 after removal of the first layer 1602 and the second layer 1603. In some cases, the fraction of metallic material adsorbed on the exposed surfaces of the wires 1604, taken against the number of surface atoms on the exposed surfaces, is at least about 0.000001%, 0.00001%, 0.0001%, 0.001%, 0.01%, 0.1%, 1%, 5%, 10%, 15%, or 20%, as measured by XPS. In other cases, however, the fraction of metallic material adsorbed on the exposed surfaces of the wires 1604, taken against the number of surface atoms on the exposed surfaces, is at most about 0.000001%, 0.00001%, 0.0001%, 0.001%, 0.01%, 0.1%, 1%, 5%, 10%, 15%, 20%, or 25%, as measured by XPS. In some situations, the fraction of metallic material adsorbed on exposed surfaces of the wires 1604, taken against the number of surface atoms on the exposed surfaces, is between about 0.000001% and 25%, as measured by XPS.

A hole or wire of the disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Exposed surfaces of holes or wires may be covered with a layer of an oxide, such as a semiconductor oxide, metal oxide, or a semiconductor and metal oxide. In some cases, the oxide is a native oxide, such as a native oxide or silicon (e.g., $SiO_2$).

The doping configuration of thermoelectric elements of the disclosure may be selected to control the thermal conductivity and thermoelectric power of a thermoelectric device having the thermoelectric elements. The thermal conductivity and the thermoelectric power may be controlled substantially independently of the electrical conductivity of the thermoelectric elements by controlling dimensions and doping, respectively, of the thermoelectric elements. As an example, the doping p-type or n-type doping concentration of thermoelectric elements comprising holes or wires may be controlled independently of the dimensions (e.g., length, hole or wire diameters) of the thermoelectric elements. Various approaches for controlling thermal conductivity and thermoelectric power of semiconductor nanowires are described in U.S. Patent Publication No. 2009/0020148 ("METHODS AND DEVICES FOR CONTROLLING THERMAL CONDUCTIVITY AND THERMOELECTRIC POWER OF SEMICONDUCTOR NANOWIRES"), which is entirely incorporated herein by reference.

Methods described herein can be implemented using systems at ultrahigh vacuum, high vacuum, vacuum, low pressure, ambient pressure or high pressure. In some cases, thermoelectric elements are formed at low pressure, such as using a vacuum chamber. In other cases, thermoelectric elements are formed in air. Alternatively, thermoelectric elements can be formed in an inert gas (e.g., $N_2$, Ar, He) atmosphere.

Methods described herein can be automated with the aid of computer systems having storage locations with machine-executable code implementing the methods provided herein, and one or more processors for executing the machine-executable code.

Example 1

Block copolymer template formation. Highly doped p-type and n-type silicon (Si) wafers (thickness: 550 µm for Si nanowire, 90 µm for Si nanomesh) were cleaned with pre-furnace cleaning process, and doped again with boron (1100° C., 6 hours) and phosphorous (900° C., 4 hours), respectively. The doped wafers were cleaned with BHF for about 15 seconds ("sec") and piranha solution for about 10 minutes ("min"), and the Si surface was neutrally treated by a random copolymer brush (1 wt. %, 1000 rpm, 20 sec.). A thin film (2 wt. %, 2500 rpm, 20 seconds, 100 nm) of asymmetric block copolymers, polystyrene-block-poly (methyl methacrylate)s (PS-b-PMMAs) forming cylindrical nanostructures (molecular weight: PS/PMMA-46.1k/21k, PMMA cylinder diameter: 20 nm, center to center distance between neighboring cylinders: 34 nm) were spin-coated onto the wafer (substrate) surfaces. After high temperature annealing at a temperature of about 190° C. for about 24 hours, the substrates were irradiated with UV (254 nm) for 30 minutes, and subsequently rinsed with acetic acid (30 minutes) and water (5 minutes) to remove PMMA cylinder cores and crosslink the PS matrix.

Example 2

Fabrication of Si nanowire thermoelectric devices. The substrate of Example 1 having a template with an array of holes was further treated in oxygen plasma ($O_2$ at 40 sccm, 20 mTorr, 50 W, 15 sec) in order to remove any remaining cylinder cores. A thin film of chromium having a thickness of about 20 nm was deposited over the template and onto exposed portion of the silicon wafers. After the deposition process, the remaining PS nanoporous template was lifted-off by sonication in a piranha solution for about 20 minutes. The sample was rinsed with strong deionized water gun and gently rubbed with cotton swab. Through this procedure, Cr nanoparticles having uniform sizes and arrayed following the hexagonal lattice of the nanotemplates were formed on the Si surface, and they were used as etching masks of Au-catalyzed Si etching. To prevent the continuous layer of Au film, the exposed Si surface was slightly etched (~20 nm) by resistive ion etching ($SF_6/C_4F_8$=10 sccm/20 sccm, 100 W/100 W, 5 mTorr, 20 seconds), and the etched Si surface was subsequently cleaned with a piranha solution and BHF for about 10 minutes and 20 seconds, respectively. Next, a thin film of Au having a thickness of about 8 nm was deposited on the Si surface. The prepared samples were dipped into $HF/H_2O_2$ aqueous solution (DI water/HF/$H_2O_2$=120 ml/30 ml/10 ml) for about 20 min. The Au catalyst film etched Si wafers and Cr etching mask provided dense vertical Si nanowire arrays. The Si nanowire samples were rinsed with a deionized (DI) water/methanol solution having a DI/methanol content from about 100/0, 75/25, 50/50, 25/75, 0/100 vol. % for about 10 min each, and dried with critical drier.

Example 3

Fabrication of Si nanomesh devices. A silicon wafer as prepared per Example 1 was treated in $CF_4/O_2$ plasma ($O_2/CF_4$=20 sccm/20 sccm, 20 mTorr, 50 W, 15 sec) in order to remove the remnant cylinder cores and etch the Si substrate slightly. The wafer was cleaned with BHF for about 10 seconds and rinsed with DI water to remove any oxide layer on the exposed Si surface. A gold (Au) film having a thickness of about 20 nm was deposited on the PS template, and the remaining PS nanoporous template was lifted-off by sonication in toluene for a period of about 3 hours to produce a Au nanoparticle array over the silicon wafer. Samples prepared according to this approach were dipped into an $HF/H_2O_2$ (DI water/HF/$H_2O_2$=120 ml/30 ml/10 ml) aqueous solution for about 100 minutes to produce a nanoporous Si nanohole array. The produced Si nanomesh samples were rinsed with DI water for 20 minutes and dried at ambient conditions (air drying, 25° C.).

Example 4

Thermoelectric heating/cooling measurement. With reference to FIG. 11, for the bulk measurements of Si nanowire and nanomesh samples, thin electrode layers (Au/Ni=400 nm/20 nm) were deposited on both sides of the prepared p-type 1101 and n-type 1102 wafers prepared according to the method described above in the context of Examples 1-3. Two Cu wires were connected with two different Cu blocks 1103 and 1104 and attached together with the aid of a Ag paste/solder. One side of the prepared samples were disposed on the two Cu blocks and attached with the Ag paste/solder. The Cu blocks serve as a heat sink. The other sides of samples were attached with the aid of a Cu strip (Alfa Aesar), and two thermocouples (Omega) were attached on the sides of the samples for temperature measurements. In the case of the heating measurement, a heat flux sensor (Omega) and a ceramic heater (Watlow Inc.) were placed on the Cu strip and firmly fixed with Kapton tape. A direct current (DC) power supply (Agilent, 6543A) was connected with the ceramic heater to control (or regulate) the applied heat flux. The thermoelectric voltage and the temperature of hot and cold sides were measured with two nanovoltmeters (Keithley, 2182A), and the output power was measured with a sourcemeter (Keithley, 2400).

Example 5

Figure 12:
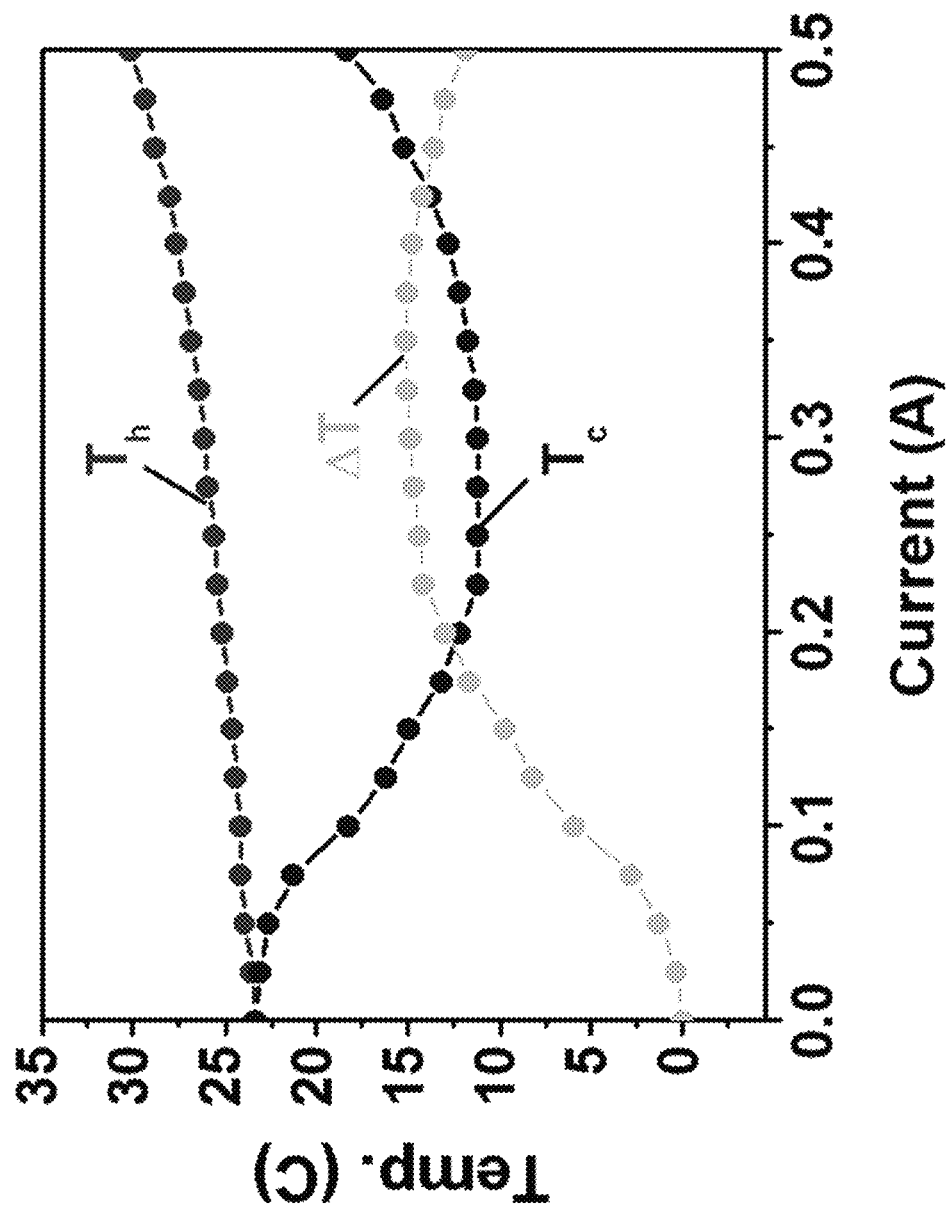
FIG. 12 shows hot side (Th), cold side (Tc) and temperature difference ($\Delta T$) plots as a function current applied to a thermoelectric device.

Cooling measurements were made with the aid of a thermoelectric device prepared according to Example 4. The temperature difference ($\Delta T$) between the hot side (Th) and cold side (Tc) of the silicon nanostructured device during cooling measurement is illustrated in FIG. 12. A current of approximately 300 mA applied to the thermoelectric device generates a maximum temperature difference of about 15° C. The resulting temperature of the cold side, as indicated by the Tc plot, is about 10° C.

Example 6

Figure 13:
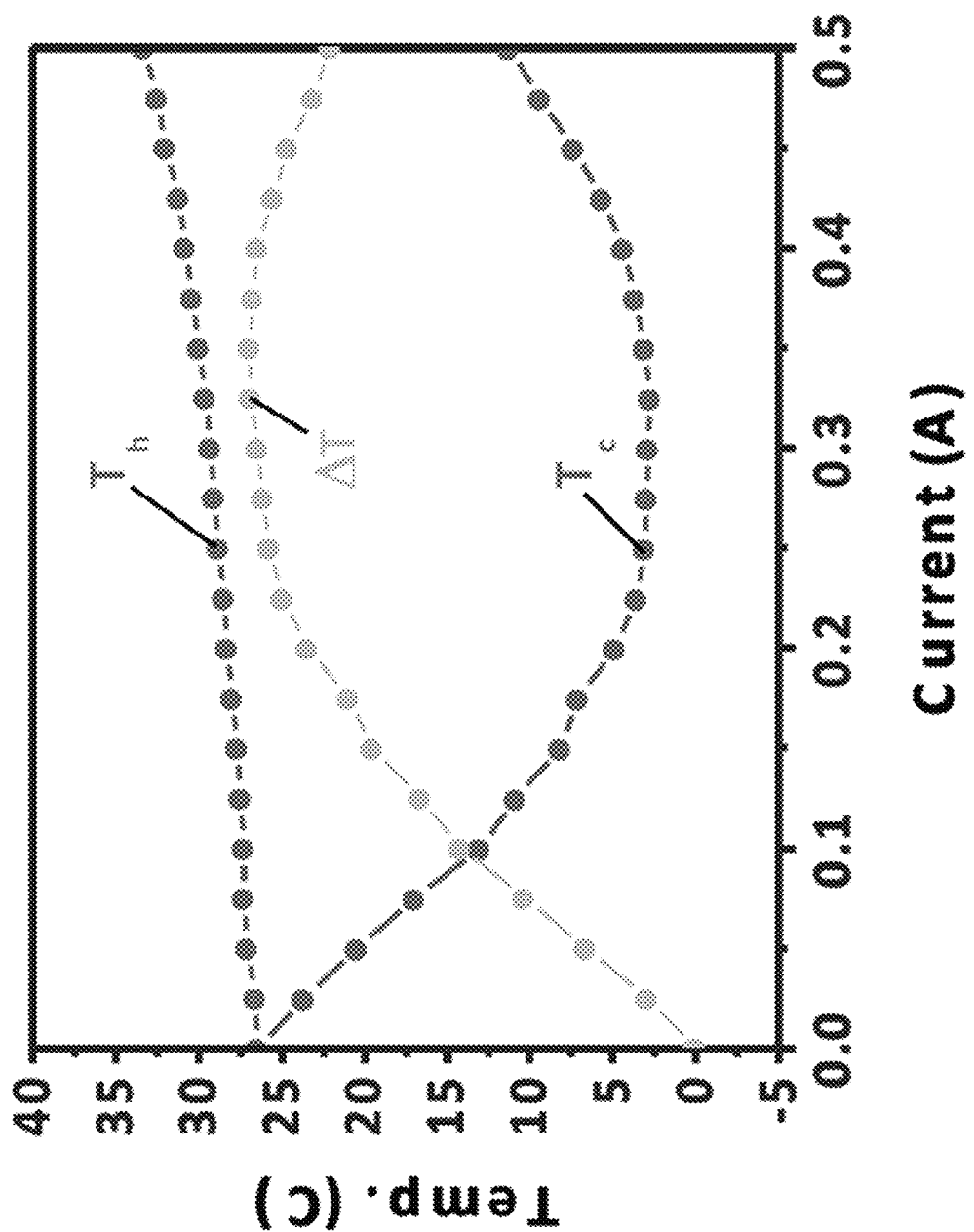
FIG. 13 shows hot side (Th), cold side (Tc) and temperature difference ($\Delta T$) plots as a function current applied to a thermoelectric device.

Cooling measurements were made with the aid of a thermoelectric device prepared according to Example 4. The temperature difference ($\Delta T$) between the hot side (Th) and cold side (Tc) of the silicon nanostructured device during cooling measurement is illustrated in FIG. 13. A current of approximately 350 mA applied to the thermoelectric device generates a maximum temperature difference of about 26° C. The resulting temperature of the cold side, as indicated by the Tc plot, is about 5° C.

While various embodiments described herein have made reference to semiconductor substrates, methods described herein may be employed for use with other types of substrates, such as substrates formed of metallic or insulating (dielectric) materials.

Devices, systems and methods provided herein may be combined with or modified by other devices, systems and methods, such as devices and/or methods described in U.S. Pat. No. 7,309,830 to Zhang et al. and U.S. Patent Publication No. 2006/0032526 to Fukutani et al., which are entirely incorporated herein by reference.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A method for forming a thermoelectric device, comprising:
   (a) forming a mask adjacent to a semiconductor substrate, the mask having three-dimensional structures in a block copolymer template;
   (b) removing the three-dimensional structures to expose portions of said semiconductor substrate;
   (c) depositing an etching layer adjacent to exposed portions of said semiconductor substrate; and
   (d) catalytically etching the semiconductor substrate with the etching layer, an oxidizing agent and an etchant.

2. The method of claim 1, wherein, in (b), said three-dimensional structures are selectively removed from said block copolymer template.

3. The method of claim 1, wherein the etching layer comprises a metal.

4. The method of claim 1, wherein the three-dimensional structures are formed of a polymeric material.

5. A method for forming a thermoelectric device, comprising:
   providing a block copolymer template adjacent to a semiconductor substrate, said block copolymer template having three-dimensional structures therein;
   selectively removing the three-dimensional structures to provide a mask having a pattern, wherein said mask exposes portions of said semiconductor substrate; and
   catalytically transferring said pattern to said semiconductor substrate.

6. The method of claim 5, wherein said catalytically transferring said pattern to said semiconductor substrate comprises:
   depositing a layer of an etching material adjacent to exposed portions of said semiconductor substrate; and
   catalytically etching the semiconductor substrate with an oxidizing agent and an etchant with the aid of said etching material.

7. The method of claim 6, wherein the etching material comprises a metal.

8. The method of claim 5, wherein the three-dimensional structures are formed of a polymeric material.

9. A method for forming a thermoelectric device, comprising:
   (a) providing, adjacent to a semiconductor substrate, a block copolymer template having three-dimensional structures distributed therein;
   (b) selectively removing the three-dimensional structures, thereby providing a mask adjacent to the semiconductor substrate;
   (c) depositing a layer of an etching material adjacent to the semiconductor substrate; and
   (d) catalytically etching the semiconductor substrate with the aid of said etching material.

10. The method of claim 9, wherein the layer of the etching material comprises a metal.

11. The method of claim 9, wherein the three-dimensional structures are formed of a polymeric material.

* * * * *